US00RE41992E

(19) United States
(12) Reissued Patent
Gupta et al.

(10) Patent Number: US RE41,992 E
(45) **Date of Reissued Patent: *Dec. 7, 2010**

(54) METHODS AND CIRCUITRY FOR BUILT-IN SELF-TESTING OF CONTENT ADDRESSABLE MEMORIES

(76) Inventors: Sanjay Gupta, 101-55 Skymark Dr., North York, ON (CA), M2H 3N4; Randall Gibson, 21321 37th Ave. SE., Bothell, WA (US) 98021

( * ) Notice: This patent is subject to a terminal disclaimer.

(21) Appl. No.: 11/514,286

(22) Filed: Aug. 30, 2006

(Under 37 CFR 1.47)

Related U.S. Patent Documents

Reissue of:
(64) Patent No.: 6,609,222
Issued: Aug. 19, 2003
Appl. No.: 09/654,197
Filed: Sep. 1, 2000

U.S. Applications:

(63) Continuation of application No. 11/208,134, filed on Aug. 19, 2005, now Pat. No. Re. 41,659.
(60) Provisional application No. 60/153,388, filed on Sep. 10, 1999.

(51) Int. Cl.
*G01R 31/28* (2006.01)

(52) U.S. Cl. ..... 714/733
(58) Field of Classification Search ..... 714/733, 714/30; 365/49
See application file for complete search history.

(56) References Cited

U.S. PATENT DOCUMENTS

| | | | | |
|---|---|---|---|---|
| 4,376,974 | A | 3/1983 | Stewart et al. | |
| 4,475,194 | A | 10/1984 | LaVallee et al. | |
| 4,532,606 | A | 7/1985 | Phelps | 365/49 |
| 4,559,618 | A | 12/1985 | Houseman et al. | 365/49 |
| 4,622,653 | A | 11/1986 | McElroy | 365/49 |
| 4,646,271 | A | 2/1987 | Uchiyama et al. | 365/49 |
| 4,670,858 | A | 6/1987 | Almy | 365/49 |
| 4,723,224 | A | 2/1988 | Van Hulett et al. | 365/49 |
| 4,758,982 | A | 7/1988 | Price | 711/108 |
| 4,794,559 | A | 12/1988 | Greenberger | 365/49 |
| 4,845,668 | A | 7/1989 | Sano et al. | |

(Continued)

FOREIGN PATENT DOCUMENTS

| | | |
|---|---|---|
| EP | 0 491 498 B1 | 6/1992 |
| EP | 0 899 668 A2 | 3/1999 |
| WO | WO 99-23664 | 5/1999 |

OTHER PUBLICATIONS

Podaima et al., A self–timed, fully–parallel content addressable queue for switching applications, May 1999, IEEE, pp. 239–242.

(Continued)

*Primary Examiner*—Shelly A Chase

(57) ABSTRACT

Methods for built-in self-test (BIST) testing and circuitry for testing a content addressable memory (CAM) core are provided. In one example, the BIST circuit includes a search port for enabling searches of the CAM core and a maintenance port for enabling addressing of locations of the CAM core. The maintenance port includes writing logic for writing to locations of the CAM core. The BIST circuit also includes a BIST controller for coordinating BIST testing of the CAM core. The BIST controller is capable of performing a BIST search on the CAM core on every cycle through the search port and performing a BIST write at selected times to the CAM core. Thus, the BIST write is capable of being performed in a same cycle as the BIST search permitting at-speed BIST. The BIST controller, performs BIST testing in a manner that limits the number of rows in the CAM that match at any given cycle, thus allowing a low-power BIST operation. The BIST controller can also be configured to coordinate simultaneous BIST testing of two or more CAM cores.

38 Claims, 27 Drawing Sheets

U.S. PATENT DOCUMENTS

| | | | | |
|---|---|---|---|---|
| 4,996,666 | A | 2/1991 | Duluk, Jr. | 365/49 |
| 5,051,949 | A | 9/1991 | Young | 365/49 |
| 5,053,991 | A | 10/1991 | Burrows | |
| 5,107,501 | A | 4/1992 | Zorian | 714/720 |
| 5,173,909 | A | 12/1992 | Sakano et al. | |
| 5,185,888 | A | 2/1993 | Tanaka et al. | |
| 5,226,005 | A | 7/1993 | Lee et al. | |
| 5,257,220 | A | 10/1993 | Shin et al. | |
| 5,319,589 | A | 6/1994 | Yamagata et al. | |
| 5,319,590 | A | 6/1994 | Montoye | 365/49 |
| 5,327,372 | A | 7/1994 | Oka et al. | |
| 5,351,208 | A | 9/1994 | Jiang | 365/49 |
| 5,467,319 | A | 11/1995 | Nusinov et al. | |
| 5,535,164 | A | 7/1996 | Adams et al. | |
| 5,555,397 | A | 9/1996 | Sasama et al. | |
| 5,568,415 | A | 10/1996 | McLellan et al. | 365/49 |
| 5,592,407 | A | 1/1997 | Konishi et al. | |
| 5,608,662 | A | 3/1997 | Large et al. | 708/300 |
| 5,619,446 | A | 4/1997 | Yoneda et al. | |
| 5,699,288 | A | 12/1997 | Kim et al. | 365/49 |
| 5,752,260 | A | 5/1998 | Liu | |
| 5,784,709 | A | 7/1998 | McLellan et al. | 711/207 |
| 5,787,458 | A | 7/1998 | Miwa | |
| 5,818,786 | A | 10/1998 | Yoneda | |
| 5,828,593 | A | 10/1998 | Schultz et al. | 365/49 |
| 5,848,074 | A | 12/1998 | Maeno | 714/720 |
| 5,859,791 | A | 1/1999 | Schultz et al. | 365/49 |
| 6,000,008 | A | 12/1999 | Simcoe | |
| 6,006,306 | A | 12/1999 | Haywood et al. | |
| 6,044,005 | A | 3/2000 | Gibson et al. | |
| 6,069,573 | A | 5/2000 | Clark, II et al. | |
| 6,081,440 | A | 6/2000 | Washburn et al. | |
| 6,199,140 | B1 | 3/2001 | Srinivasan et al. | |
| 6,199,149 | B1 | 3/2001 | Meinerth et al. | |
| 6,230,236 | B1 | 5/2001 | Schultz et al. | |
| 6,243,281 | B1 | 6/2001 | Pereira | |
| 6,253,280 | B1 | 6/2001 | Voelkel | |
| 6,272,588 | B1 | 8/2001 | Johnston et al. | |
| 6,275,406 | B1 | 8/2001 | Gibson et al. | |
| 6,286,116 | B1 | 9/2001 | Bhavsar | 714/720 |
| 6,339,539 | B1 | 1/2002 | Gibson et al. | |
| 6,362,990 | B1 | 3/2002 | Gibson et al. | |
| 6,392,910 | B1 | 5/2002 | Podaima et al. | |
| 6,496,950 | B1 | 12/2002 | Zhao et al. | 714/718 |
| 6,553,453 | B1 | 4/2003 | Gibson et al. | |
| 6,591,331 | B1 | 7/2003 | Khanna | |
| 6,609,222 | B1 | 8/2003 | Gupta et al. | |

OTHER PUBLICATIONS

Kang et al., Built–in self test for content addressable memories, 1997, IEEE, pp. 48–53.

McAuley et al., A reconfigurable content addressable memory, 1990, IEEE, pp. 24.1.1–24.1.4.

Sidorowicz et al., Verification of CAM test for inputs stuck–at Faults, Aug. 1998, department of computer science, University of Waterloo, pp. 1–7.

Komachuk et al., A high speed embedded cache design with non–intrusive BIST, 1994, IEEE, p. 40–45.

Wade et al., A Ternary content addressable search engine, Aug. 1989, IEEE Journal of solid–state circuits, vol. 24, No. 4, pp. 10003–1013.

Nadeau–Dostie et al., A serial interfacing technique for built–in external testing of embedded memories, 1989, IEEE, p. 22.2.1–22.2.5.

Ghose, The architecture of response–pipelined content addressable memories, Microprocessing and Microprogramming, Jul. 1994, pp. 387–410, vol. 40, No. 6.

Uvieghara et al., An On–Chip Smart Memory for a Data–Flow CPU, IEEE Journal of Solid–State Circuits, Feb. 1990, pp. 84–94, vol. 25, No. 1.

Yamagata et al., A 288–kb Fully Parallel Content Addressable Memory Using a Stacked–Capacitor Cell Structure, IEEE Journal of Solid–State Circuits, Dec. 1992, pp. 1927–1933, vol. 27, No. 12.

The European Search Report for EP application Serial No. 00307758 completed on Dec. 18, 2000.

The European Search Report for EP application Serial No. 00307759 completed on Dec. 18, 2000.

Notice of Allowance for related U.S. Appl. No. 11/208,134, mailed Jun. 10, 2009.

US Office Action on U.S. Appl. No. 11/208,134, mailed Sep. 17, 2009.

Notice of Allowance on U.S. Appl. No. 11/208,134, mailed May 10, 2010.

METHODS AND CIRCUITRY FOR BUILT-IN SELF-TESTING OF CONTENT ADDRESSABLE MEMORIES

Matter enclosed in heavy brackets [ ] appears in the original patent but forms no part of this reissue specification; matter printed in italics indicates the additions made by reissue.

CROSS REFERENCE TO RELATED APPLICATIONS

[This application] *More than one reissue application has been filed for the reissue of U.S. Pat. No. 6,609,222. The present application is a continuation reissue application of U.S. patent application Ser. No. 11/208,134 filed Aug. 19, 2005, which is a reissue application of U.S. Pat. No. 6,609, 222, which* claims priority [from] *to* U.S. Provisional Patent Application No. 60/153,388 filed Sep. 10, 1999, and entitled "Content Addressable Memory Circuitry." This provisional application is incorporated herein by reference.

BACKGROUND OF THE INVENTION

1. Field of the Invention

The present invention relates generally to memory circuits, and more particularly to built-in self test (BIST) circuitry for content addressable memory (CAM) circuits.

2. Description of the Related Art

Modern computer systems and computer networks utilize memory devices for storing data and providing fast access to the data stored therein. A content addressable memory (CAM) is a special type of memory device often used for performing fast destination searches for data stored in the CAM. For example, Internet routers often include a CAM for searching the address of specified data. Thus, the use of CAMs allows routers to perform address searches to facilitate more efficient communication between computer systems over computer networks. Besides routers, CAMs are also utilized in other areas where fast-searches are required such as databases, network adapters, image processing, voice recognition applications, etc.

Conventional CAMs typically include a two-dimensional row and column content addressable memory core array of cells. In such an array, each row typically stores an address, pointer, or bit pattern entry. In a read/write configuration, a CAM may perform "read" and "write" operations at specific addresses as is done in conventional random access memories (RAMs). In another configuration, CAMs unlike RAMs, can perform data "search" operations that simultaneously compare a bit pattern of data against an entire list (i.e., column) of prestored entries (i.e., rows).

As with most memory devices, the conventional CAMs may fail to operate properly due to any number of faults. For example, bit cells of the CAM array may become stuck at some value. Another type of fault occurs when bit cells become electrically coupled during write operations. In such cases, when a specific value is written to one bit cell, the other bit cell in the same row or a different row acquires the same value. Another type of fault is a transition fault, which prevents a bit cell from transitioning from one state into another state. Yet another example is when an address decoding fault occurs, thus causing a wrong cell or cells to be addressed, thereby resulting in the access of data in the wrong location.

Still another type of fault occurs when electrical shorts or other defects cause circuit or memory elements to be stuck-at some value, thereby preventing proper operation of the CAM. Such faults may occur in a CAM itself or its peripheral circuitry. Another fault occurs when CAM circuits operate at a slower speed than expected due to variations in such factors as IC fabrication process, temperature, or voltage. As can be appreciated, such dynamic faults cause undesired delays that can degrade performance of CAM circuits.

To guard against such faults, one approach is to implement a built-in self-test (BIST) technique for detecting some of these types of faults. For example, U.S. Pat. No. 5,107, 501 by Yervant Zorian, which is incorporated herein by reference, discloses a BIST technique for testing the data bits in a conventional binary CAM using write and read-match operations. While such method detects faults such as electrical short and open faults and stuck-at faults, it is not well suited for detecting faults in ternary CAMs. Specifically, the bit cells in ternary CAMs are characterized not only by binary states of "0" and "1," but also by a "don't care" state, which denotes that the state of the associated bit cell is not relevant to a particular CAM search. Consequently, not all functional aspects of a ternary CAM can be tested using the teachings of Zorian.

Also, Zorian can only perform writes to set up searches when search operations are not being performed. Consequently, there will be cases in which BIST searching cannot be performed for several cycles until write operations are complete. This, of course, slows down BIST testing and does not allow the BIST testing to be at the functional speed. Furthermore, the BIST technique described by Zorian tests the CAM rows simultaneously. This technique triggers matches in all rows of the CAM and results in very high power consumption. In essence, the Zorian design is impractical for today's larger CAM implementations. Practical CAM devices with large storage capacities are designed to be used only in a manner that does not cause matches in more than some limited number of rows simultaneously.

In view of the foregoing, what is needed is a method for BIST testing of CAM circuitry and associated BIST testing circuitry.

SUMMARY OF THE INVENTION

The present invention fills this need by providing an architecture for performing built-in self-test (BIST) for CAMS. It should be appreciated that the present invention can be implemented in numerous ways, including as a process, an apparatus, a system, a device, or a method. Several embodiments of the present invention are described below.

In one embodiment, a built-in self-test (BIST) circuit for testing a content addressable memory (CAM) core is disclosed. The BIST circuit includes a search port for enabling searches of the CAM core and a maintenance port for enabling addressing of locations of the CAM core. The maintenance port includes writing logic for writing to addresses of the CAM core. The BIST circuit also includes a BIST controller for coordinating BIST testing of the CAM core. The BIST controller is capable of performing a BIST search on the CAM core on every cycle through the search port and performing a BIST write at selected times to the CAM core. Thus, the BIST write is capable of being performed in a same cycle as the BIST search.

In another embodiment, a built-in self-test (BIST) circuit for testing a content addressable memory (CAM) core is disclosed. The BIST circuit includes a search port for enabling searches of the CAM core and a maintenance port for enabling addressing of addresses of the CAM core. The maintenance port further includes writing logic for writing to addresses of the CAM core. A BIST controller for coordinating BIST testing of the CAM core is also provided. The BIST controller is capable of performing a BIST search and a BIST write on the CAM core at the same time.

In another embodiment, the search port and maintenance port are distributed and are not part of the BIST controller, so as to reduce the number of global wires required to communicate read/write/search data and results to the CAM core.

In yet another embodiment, content addressable memory (CAM) circuitry with BIST testing capabilities is disclosed. The circuitry includes a plurality of CAM cores and a plurality of BIST circuits that are coupled to each of the CAM cores. A single BIST controller is also included and is capable of controlling BIST testing of each of the plurality of CAM cores. Preferably, the single BIST controller is configured to perform BIST searches on each of the plurality of CAM cores during each cycle and is further configured to perform BIST writing during any cycle including a cycle in which the BIST search occurs.

In still a further embodiment, a method for performing built-in self-test (BIST) testing on a content addressable memory (CAM) core is disclosed. The method includes: (a) writing test data to memory addresses in the CAM core; and (b) searching for test data in the CAM core, the searching being continuously performed one cycle after another and the writing of the test data capable of being performed in a same cycle as one or more search performed during the searching. In one aspect of this embodiment, the method can further include an operation of selecting one row of the CAM core to be valid during the searching, such that matches only occur in the one row in one of the cycles. This aspect enables low power BIST testing.

The advantages of the present invention are numerous. Most notably, the BIST testing architecture enables testing of a CAM core separate from the testing of priority encoders (PEs). In one embodiment, separately testing the CAM core is configured to further enable the testing of one row of the CAM core at a time. This capability will reduce the power consumption during BIST testing. A further advantage of the present invention is the ability of the BIST testing architecture (e.g., by way of the BIST controller) to execute uninterrupted searches at each cycle while simultaneously performing writes that set up subsequent searches. For example, the BIST controller is capable simultaneously accessing the search port and the maintenance port of a CAM core. This functionality enables BIST testing of a CAM core at more realistic speeds which resemble realistic CAM operation.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for the built-in self-test (BIST) of a content addressable memory (CAM) core with ternary storage (including a don't care state) is disclosed. In one embodiment, the ternary CAM also contains binary valid and tag bits. The testing of CAM cores in accordance with the present invention is configured to test the CAM cores separate from priority encoders (PE). Separating the testing of the CAM core from the testing of PE enables BIST testing of one row of the CAM core at a time. By doing this, lower power operation can be achieved during BIST testing. A further feature of the present invention is the ability of the BIST testing architecture to execute uninterrupted searches at each cycle while simultaneously performing writes that set up subsequent searches. This functionality enables BIST testing of a CAM core at more realistic speeds which resemble the functional CAM speed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
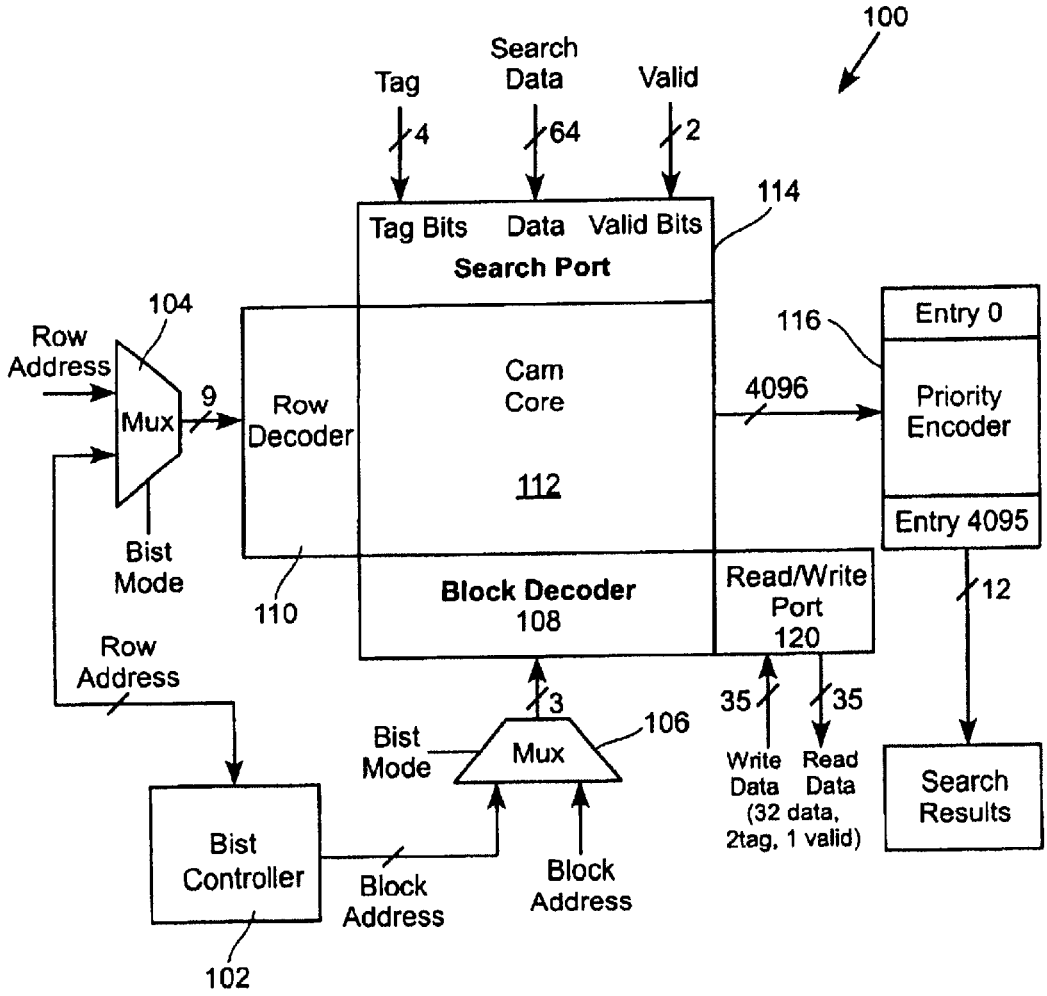
FIG. 1 shows a block diagram of a CAM core implementing BIST circuitry in accordance with one embodiment of the present invention.

FIG. 1 shows a block diagram 100 of a CAM core implementing BIST circuitry in accordance with one embodiment of the present invention. In one embodiment, ternary CAMs are preferably used instead of binary CAMs because ternary CAMs speed up routing and address translation, which is important in high speed applications, such as Internet applications. The CAM core 112 is shown in communication with a block decoder 108, a row decoder 110, a search port 114 and a read/write port 120. The CAM core 112 is coupled to a priority encoder 116. The priority encoder 116 is configured to select the highest priority matching result for a CAM search. During BIST operation, a BIST controller 102 is configured to provide inputs to multiplexers 104 and 106, in the form of row addresses and block addresses respectively. The multiplexers 104 and 106 are thus provided with a BIST mode select signal to enable operation in the test mode, as opposed to a functional mode. The search port 114 receives, as inputs, tag bits, search data and valid bits. The read/write port 120 receives, as inputs, write data, tag and valid bits and sends, as outputs, read data, tag and valid bits. The functionality of the tag bits, and valid bits will be described in greater detail below.

During a search, whether it be during BIST operation or functional operation, search data is provided by way of the search port 114 and the matches are communicated from the CAM core 112 to the priority encoder 116. In this example, the CAM core 112 has 4096 rows, and each row is coupled by way of a bus to the priority encoder 116. Thus, the priority encoder 116 will have 4096 entries with entry 0 having the highest priority and entry 4095 having the lowest priority for a search result. Consequently, the priority encoder 116 is charged with outputting a search result, which represents the match having the highest priority.

Figure 2A:
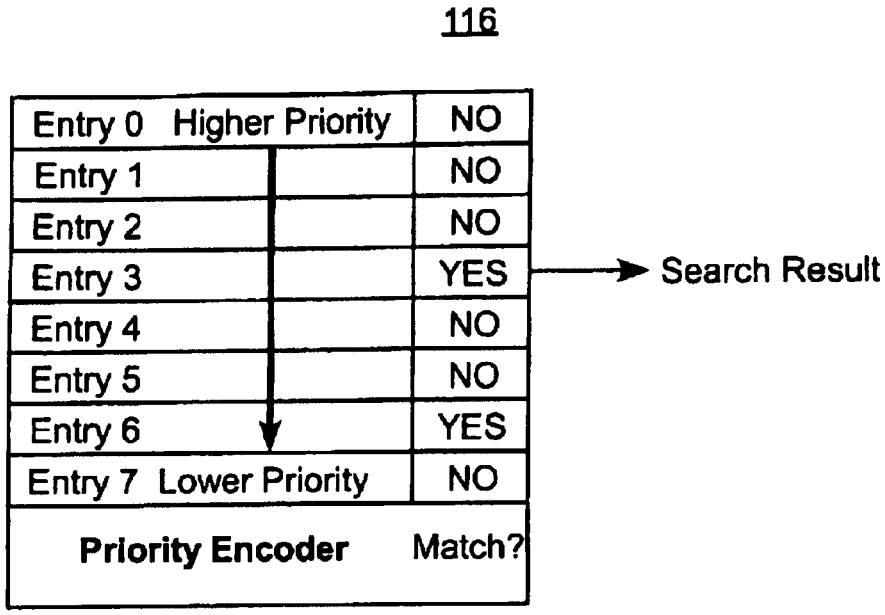
FIG. 2A shows a simplified example of the internal structure of the priority encoder 116.

For illustration purposes, FIG. 2A shows a simplified example of the internal structure of the priority encoder 116. Thus, if the priority encoder 116 only received an 8 bit bus instead of the 4096 bit bus, all matching entries are ranked depending on their priority. As shown, entry 3 and entry 6 are both recorded as matches. Of these matches, entry 3 has a high priority than entry 6. Therefore, the address for entry 3 is designated as the search result.

Figure 2B:
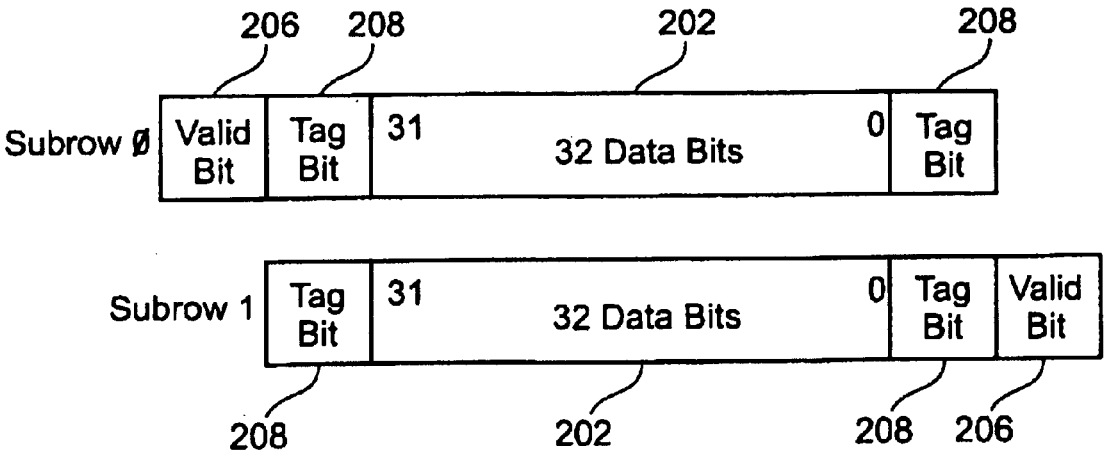
FIG. 2B shows a detailed view of two subrows (i.e., subrow 0 and subrow 1) that define each ternary word of the CAM core.

In this example, the CAM core consists of 4096 rows of 32 ternary data bits 202, 4 binary tag bits 208, and 2 binary valid bits 206 each. Since the CAM is ternary, each row of 32 ternary data bits is implemented as 2 sub-rows of 32 binary bits each. FIG. 2B shows a detailed view of the two sub-rows (sub-row 0 and sub-row 1) that define each 32 bit word of the CAM core 112. Thus a ternary "don't-care" bit i is stored as a logic "11" pattern at bit i in the two sub-rows, while a logic "0" and "1" ternary states are stored as "01" and "10" patterns respectively. In addition to the 32 data bits 202, each sub-row will also include a valid bit 206 and two tag bits 208. Specifically, sub-row 0 first has a valid bit 206, followed by a tag bit 208, data bits 202, and a tag bit 208. Sub-row 1 first has a tag bit 208, followed by data bits 202, a tag bit 208, and a valid bit 206. In operation, both valid bits 206 must be "1" to indicate valid sub-rows before a search operation can find a match. Accordingly, valid bits indicate whether a word has valid data. Tag bits are used to track the width of words. In general, the tag bits may be used to track any information and tag bits are viewed generally as regular data bits. In any event, when BIST testing is performed, the tag bits and valid bits are tested as any other bit is tested in the CAM core.

For read/write operations, the row decoder is designed to address each sub-row individually. Thus, the read/write ports on the CAM have 32 data bits, 2 tag bits, and 1 valid bit. For search operations however, both sub-rows are compared simultaneously against the search port data. Since the search port data is also ternary, it is encoded similarly as above, and thus consists of 64 bits of search data and 4 bits of tag data. Valid bits are not provided since the search is restricted over valid rows only, in this example.

Figure 3:
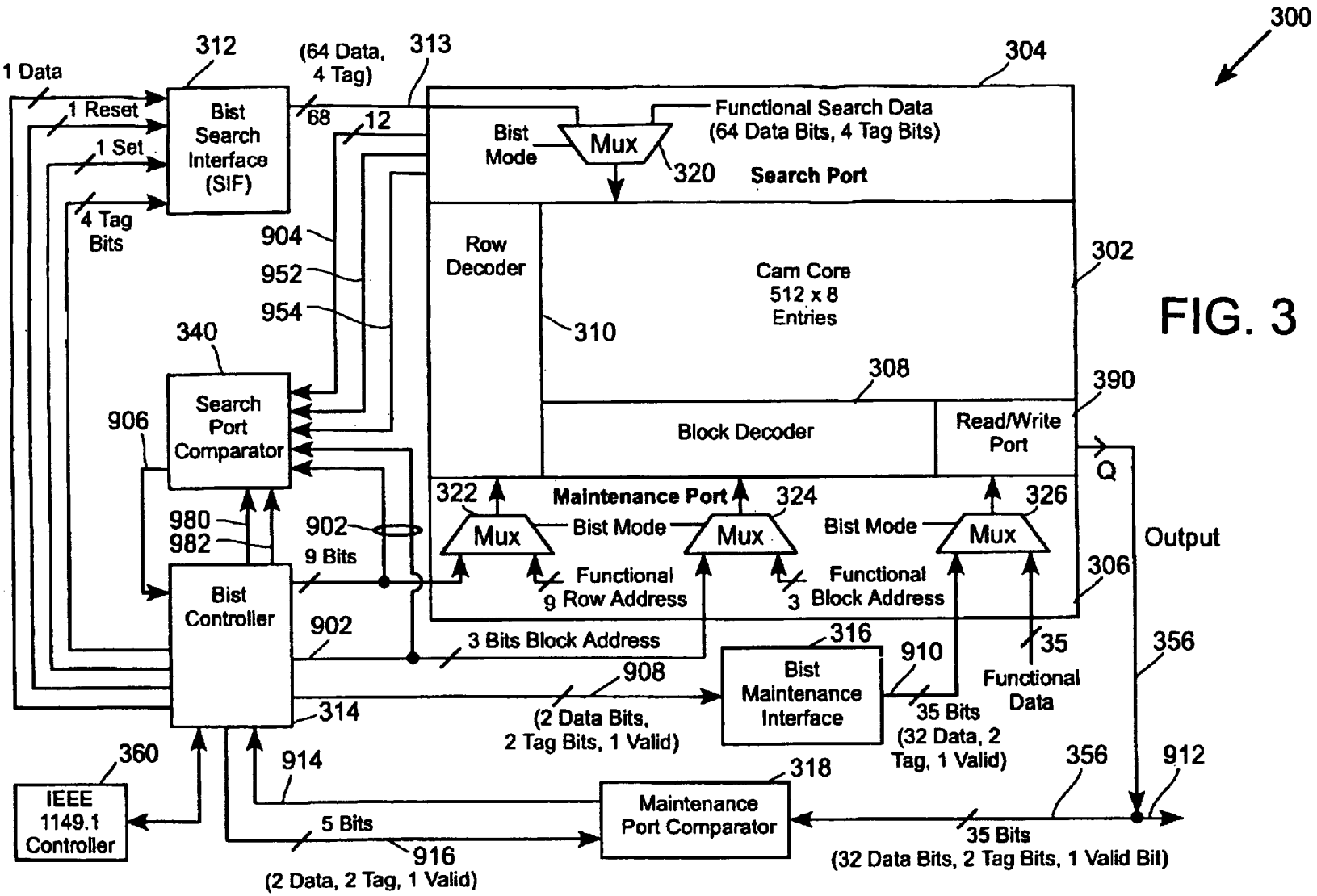
FIG. 3 shows a detailed block diagram of a CAM circuit capable of operating BIST operations, in accordance with one embodiment of the invention.

FIG. 3 shows a detailed block diagram 300 of a CAM circuit capable of operating BIST operations, in according to one embodiment of the invention. A CAM core 302 is shown coupled to a search port 304, a maintenance port 306, a block decoder 308, and a row decoder 310. The search port 304 includes circuitry, such as a multiplexer 320. Multiplexer 320 accepts search data (e.g., 64 bits of data and 4 tag bits) from a BIST search interface (SIF) 312 and functional search data, and can be controlled to operate in either functional mode or BIST mode. When in BIST mode, the multiplexer 320 selects BIST mode search data. The Maintenance port 306 is shown including a number of multiplexers 322, 324, and 326. Each of the multiplexers can be controlled to either operate in the BIST mode or the functional mode. Multiplexer 322 is coupled to the row decoder 310, the multiplexer 324 is coupled to the block decoder 308, and the multiplexer 326 is coupled to the read/write port 390 of the CAM core and is configured to introduce data to the CAM core 302 during a writing operation.

The BIST circuitry further includes the BIST search interface (SIF) 312, a BIST controller 314, a BIST maintenance interface 316, the search port comparator 340, and a maintenance port comparator 318. The BIST controller 314, in one embodiment, is a state machine that executes the CAM BIST algorithm of the present invention, and will be described in greater detail with reference to FIGS. 5. The CAM BIST algorithm processed by the BIST controller 314 can be defined by Verilog® code (i.e., register transfer level description), which can then be synthesized into gates. Also provided is an IEEE 1149.1 controller, which is commercially available in Verilog® form. When operating in BIST mode, the BIST search interface (SIF) 312 will provide 64 bits of search data, to the search port 304 by way of a bus 313. The 64 bits of search data are generated by a shift register in the SIF 312, which receives a 1 bit data input from the BIST controller 314. The bus 313 will also be used to communicate 4 tag bits provided by the BIST SIF 312 to the search port. The BIST SIF 312 will also receive control signals controlling the shift register, including a set and a reset signal from the BIST controller 314. As mentioned earlier, the multiplexer 320 will therefore communicate the 64 bits of search data and 4 bits of tag to the CAM core 302 when the multiplexer 320 operates in BIST mode. The BIST controller 314 is configured to write in different sequences of bits to different locations in the CAM core 302. The writing performed by the BIST controller 314 is facilitated by the multiplexer 322 and the multiplexer 324 of the maintenance port 306. In accordance with the present invention, it is possible for the BIST controller 314 to perform writes to the CAM core 302 at the same time searches are performed. That is, searches can be performed in each cycle and the writes can be performed at the same time (e.g., writes can be performed to set up the searches performed during BIST testing). For example, the BIST controller 314 communicates BIST row addresses and BIST block addresses 902 to each of the multiplexers 322 and 324. At the same time, since the BIST operates on one row at a time, the BIST row addresses and the BIST block addresses 902 are communicated to the search port comparator 340 as the expected row and block addresses for searches.

The BIST controller 314 is also shown receiving signals 952 and 954 from the search port 340. The signals 952 and 954 represent "hit" (i.e., a CAM row matches the search data) and multiple hit (referred to as "mult" since more than 1 CAM row matches the search data) results obtained from a search. As shown, signals 952 and 954 originate from the search port 304. During a BIST search, the search port comparator 340 will also be receiving the search addresses by way of bus 904 from the search port 304. In the search port comparator 340, the expected search addresses 902 are compared to the search addresses 904 to produce a search result that is communicated by way of bus 906 to the BIST controller 314. The search port comparator 340 will also compare hit and mults 952 and 954 to expected hits and mults 980 and 982 to produce search results that are also communicated over bus 906. If the search comparator 340 generates a match between 902 and 904, between 952 and 980, or between 954 and 982, then for each match a logic 1 will be produced (otherwise, a logic 0 will be produced if no match occurs). In BIST mode, the BIST controller 314 will also be communicating 2 data bits, 2 tag bits, and 1 valid bit via bus 908 to the BIST maintenance interface 316. In one embodiment, only 4 types of data are written into the CAM, so 2 data bits are sufficient to express the data. The BIST maintenance interface 316 is capable of performing well known expansion operations on the data. In this case, the data from the BIST controller is replicated to generate 32 data bits, 2 tag bits, and 1 valid bit over a bus 910 which communicates with the multiplexer 326. This scheme greatly reduces the number of global wires required to communicate BIST data, greatly simplifying chip routing.

The maintenance port comparator 318 is configured to receive 2 bits of expected data, 2 bits of expected tag and 1 bit of expected valid over bus 916. In one embodiment, there are four types of expected data, and therefore, 2 bits are sufficient to express the expected data. As shown, the maintenance port comparator 318 will receive the output Q for a search from the read/write port 390 over bus 356. The result of the comparison in the maintenance port comparator 318 (i.e., between 916 and 356) is then communicated over bus 914 to the BIST controller 314. If matches are obtained, a logic 1 is generated, otherwise a logic 0 is produced. As shown, the BIST controller 314 is also connected to the IEEE 1149.1 controller 360 in order to communicate control and status signals to the external world. The IEEE 1149.1 standard is herein incorporated by reference.

Figure 4A:
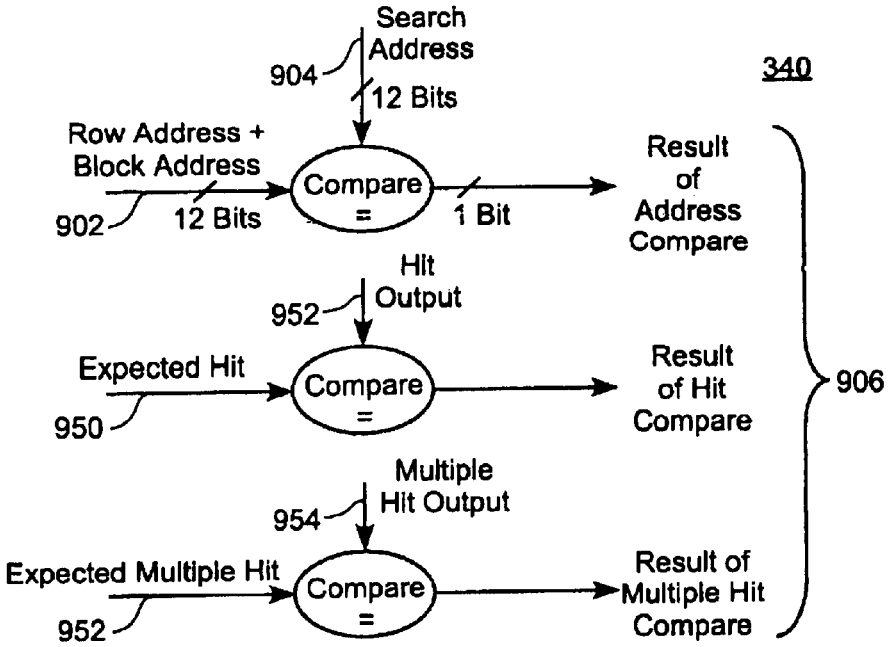
FIG. 4A shows a more detailed diagram of the search port comparator of FIG. 3, in accordance with one embodiment of the present invention.

FIG. 4A shows a more detailed diagram of the search port comparator 340 of FIG. 3, in accordance with one embodiment of the present invention. Search port comparator 340 receives search addresses 904, and row and block addresses through bus 902, which constitutes the expected search address. The comparator will take the search addresses 904 and the row and block address to produce a search result that is output through bus 906. In this embodiment, the search address, and the row and block addresses are provided over 12 bit buses. As mentioned above, the search result is communicated to the BIST controller 314. Also performed by the search port comparator 340 is a comparison between the hit and mult 952 and 954 and the expected hit and mult 980 and 982 to produce a result that is also output through bus 960. If a match is obtained in these comparisons, a logic 1 is produced. Of course, the preferred convention of assigning 1's to matches and 0's to non-matches can be changed based on preference and design.

Figure 4B:
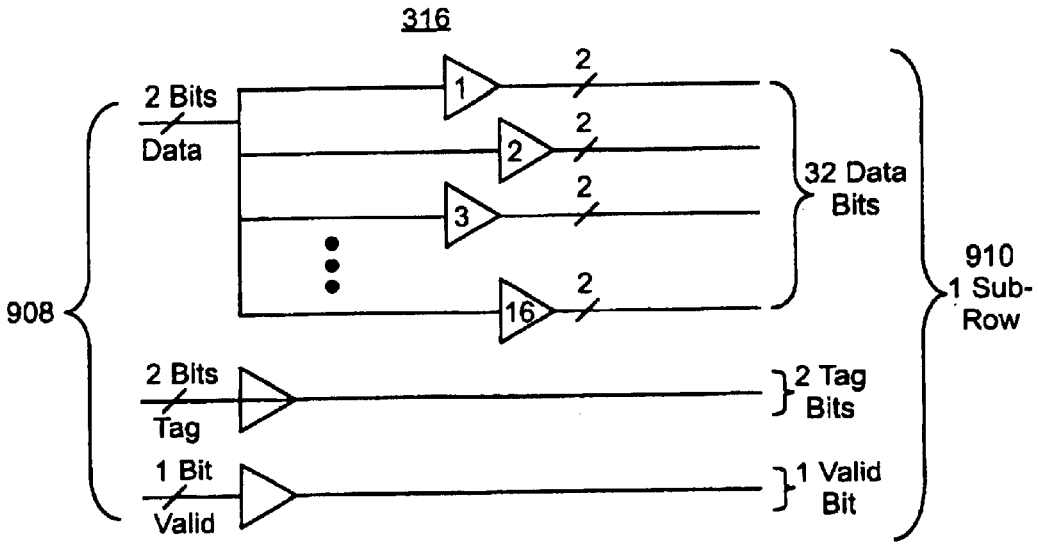
FIG. 4B shows a more detailed diagram of the BIST maintenance interface of FIG. 3, in accordance with one embodiment of the present invention.

FIG. 4B shows a more detailed diagram of the BIST maintenance interface 316 of FIG. 3, in accordance with one embodiment of the present invention. BIST maintenance interface 316 receives 2 data bits, 2 tag bits, and a valid bit as inputs through bus 908 from BIST controller 314. As mentioned above, the BIST maintenance port 316 is configured to perform an expansion function to produce 32 bits of data. The data bits, the tag bits, and the valid bit are each preferably buffered before being communicated as BIST data through bus 910 to maintenance port 306.

Figure 4C:
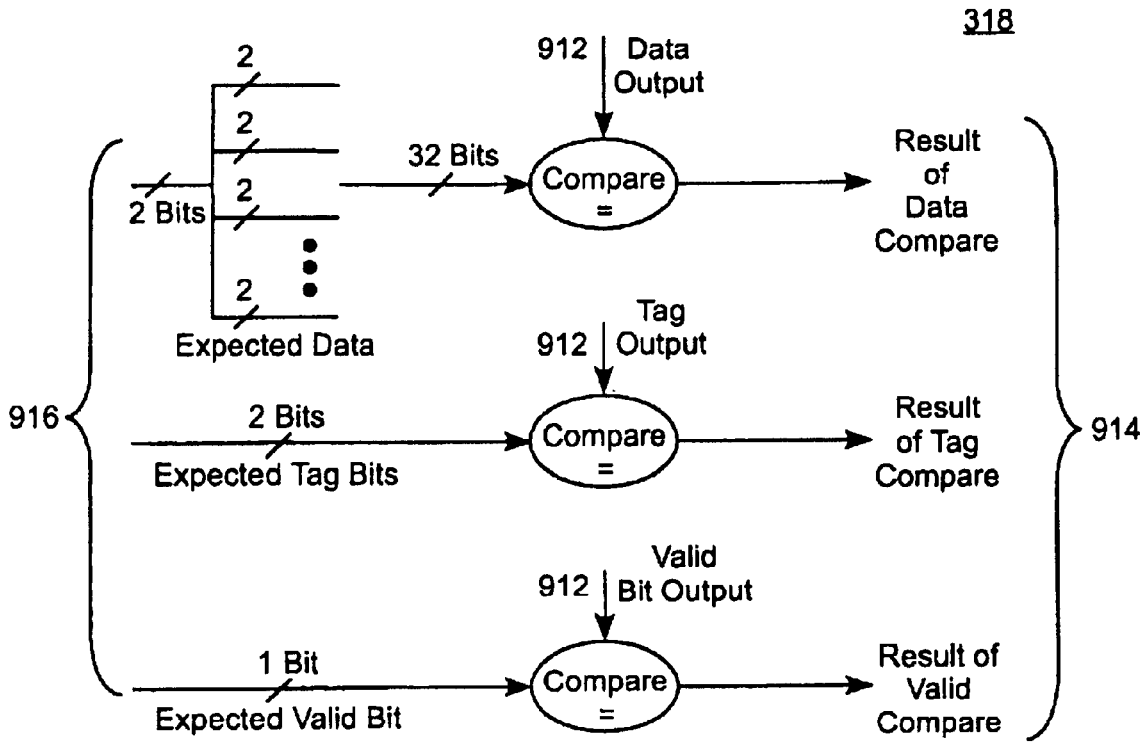
FIG. 4C shows a more detailed diagram of the maintenance port comparator of FIG. 3, in accordance with one embodiment of the present invention.

FIG. 4C shows a more detailed diagram of the maintenance port comparator 318 of FIG. 3, in accordance with one embodiment of the present invention. Maintenance port comparator 318 includes three comparators for data bits, tag bits, and valid bits and receives expected data from BIST controller 314 through bus 916 and actual data from read/write port 390 through bus 912, and provides the result of the comparison to BIST controller 314 through bus 914.

Figure 4D:
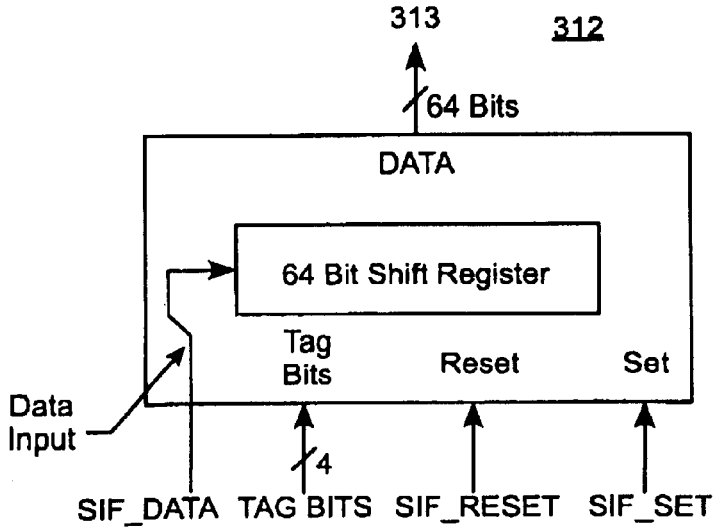
FIG. 4D shows a more detailed diagram of the BIST search interface (SIF) of FIG. 3, in accordance one embodiment of the present invention.

FIG. 4D shows a more detailed diagram of the BIST search interface (SIF) 312 of FIG. 3, in accordance with one embodiment of the present invention. BIST search interface 312 is implemented as a 64 bit shift register that receives a 1 bit "SIF_data," from the BIST controller. The SIF 312 also receives control signals, specifically a reset and set, control signal inputs from BIST controller 314 and provides BIST search data to search port 304 through bus 313. Once again, the use of a shift register permits BIST search data to be communicated over a single wire plus two control signals, thus significantly reducing the number of BIST related global wires.

FIGS. 5 show a flowchart for a method implementing BIST testing for a ternary CAM in accordance with one embodiment of the present invention. As mentioned above, the BIST testing is controlled by the BIST controller 314. Therefore, the following method operations represent algorithm operations carried out by the BIST controller 314. As will be appreciated by those skilled in the art, the BIST controller 314 of the present invention is capable of simultaneously searching by way of the search port 304 of the CAM core 302 and writing using the maintenance port 306. This is particularly powerful since conventional designs do not allow for continuous searching during write operations. In contrast, the prior art requires that searches be stopped for one or more cycles while data is written to the CAM core to set up a next search or searches. The powerful architecture of the present invention therefore facilitates high speed BIST testing, which more accurately resembles the functional operation of a CAM. That is, the BIST testing can be carried out at-speed or nearly at speed, thus enabling more realistic testing of CAM cores.

With the foregoing in mind, the method begins at an operation 500 where all cells in the CAM core are initialized to logic 0 by writing successively to all locations in the CAM. That is, during the initialization, the tag bits, data bits, and valid bits are all initialized to zero. Once initialized, the method moves to an operation 502 where the built-in self-test (BIST) testing will begin with valid bit testing and start at a particular address. The particular address may be any location in the CAM core. Typically BIST testing begins at one point in the CAM core and will proceed address-by-address until the entire CAM core has been tested using the BIST algorithm. Valid bit testing begins at an operation 504 where logic 1 is written to the valid bit of a subrow 0. Simultaneously, a search is performed where the search data and search tag bits are all logic 0, and the expected result is a miss. As mentioned earlier, searching can be performed at each cycle and writing can be performed at the same time searches are being performed.

In one implementation of a CAM, a write operation takes effect only at the end of the cycle in which the operation is initiated, while a search operation takes effect at the beginning of the cycle. Thus when a search and a write are initiated in the same cycle, the write data is not included in the current search, but in a search initiated in a subsequent cycle. Moving from operation 504 to operation 506, it is determined in operation 506 whether a miss occurred, knowing that a miss was expected in operation 504. If a miss did not occur as expected, the method proceeds to an operation 507 where a flag is set indicating that the BIST test failed.

Figure 5A:
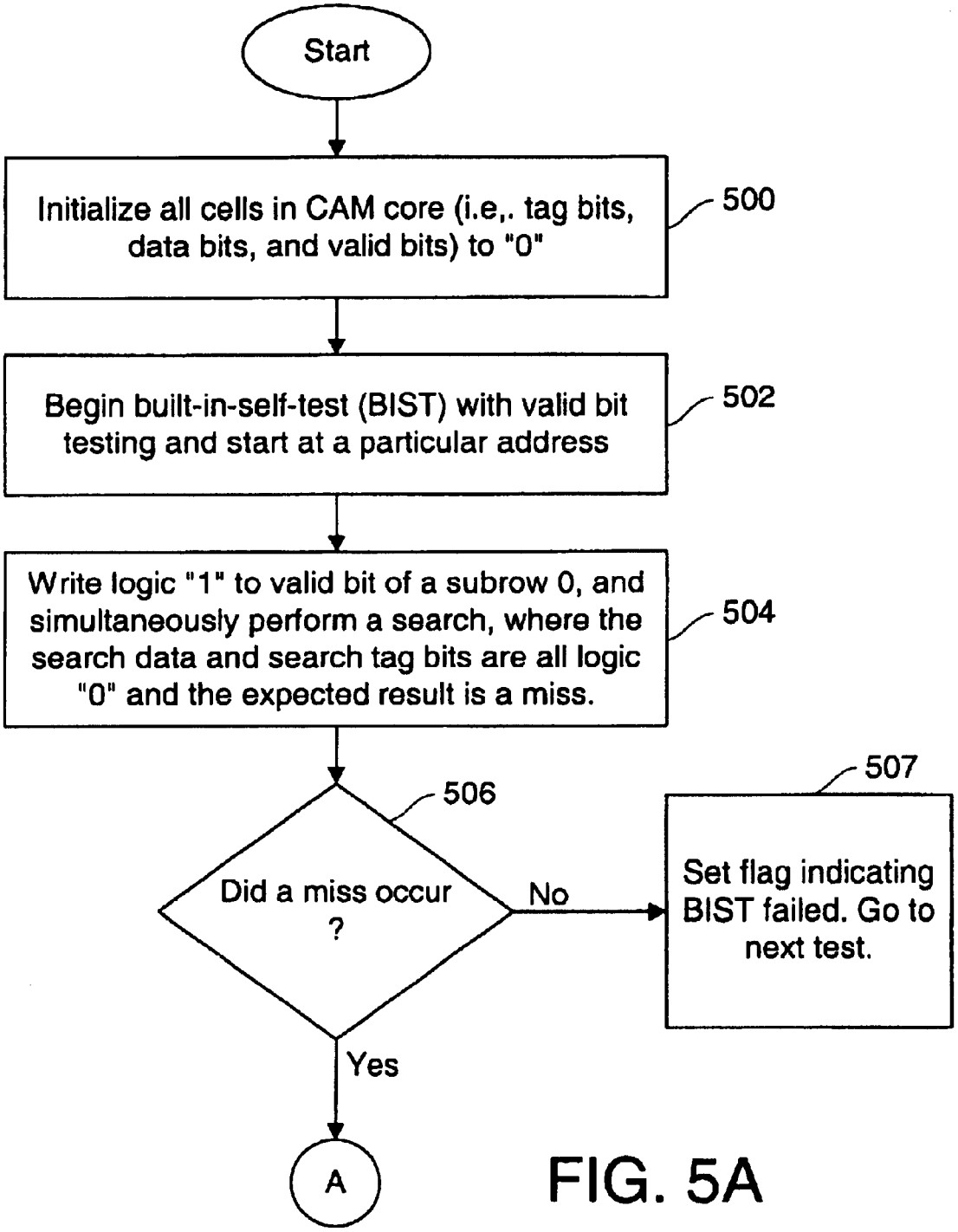
FIGS. 5A–5U show a flowchart for a method implementing BIST testing for a ternary CAM, in accordance with one embodiment of the present invention.
Figure 5B:
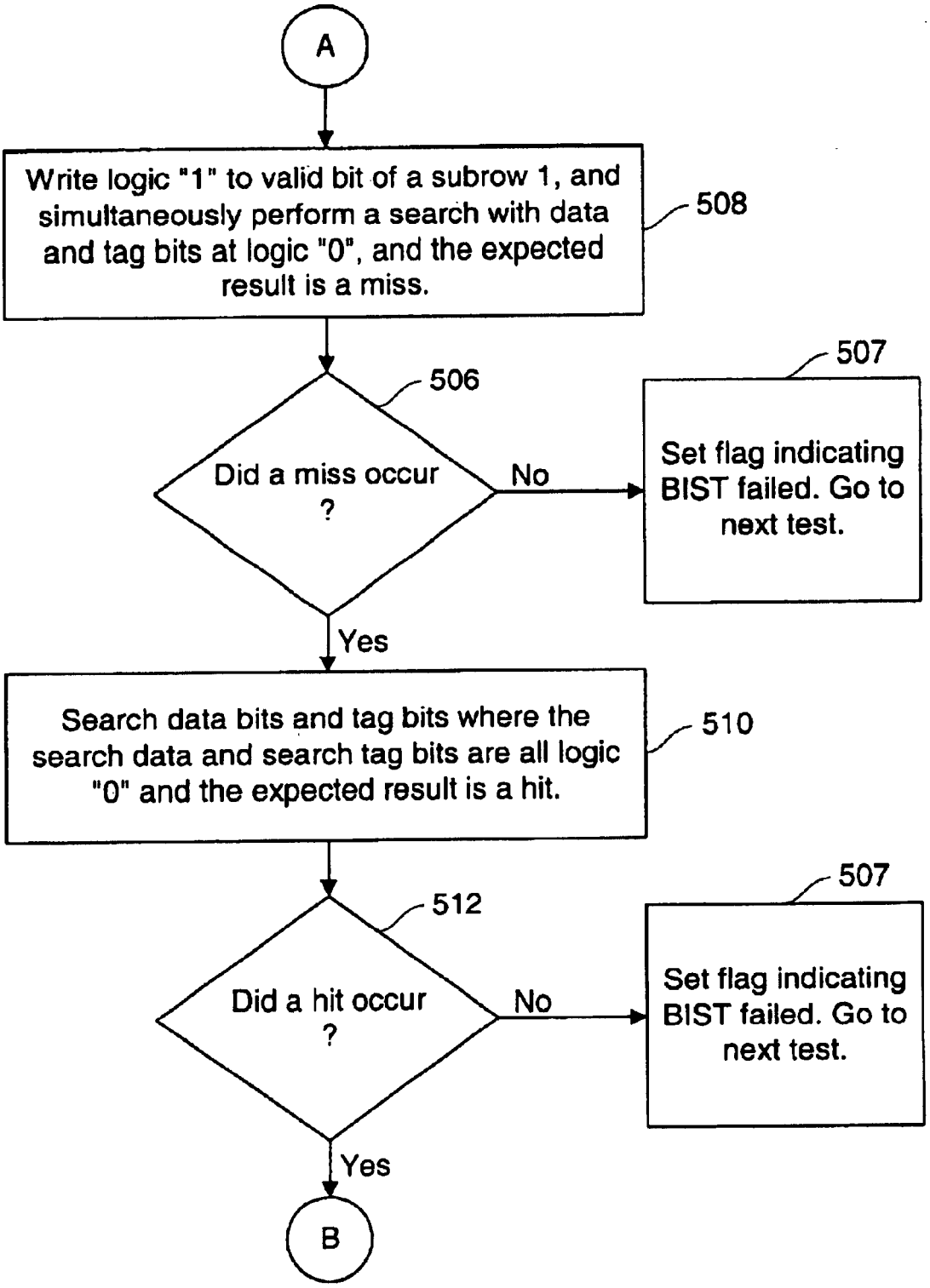
Figure 5C:
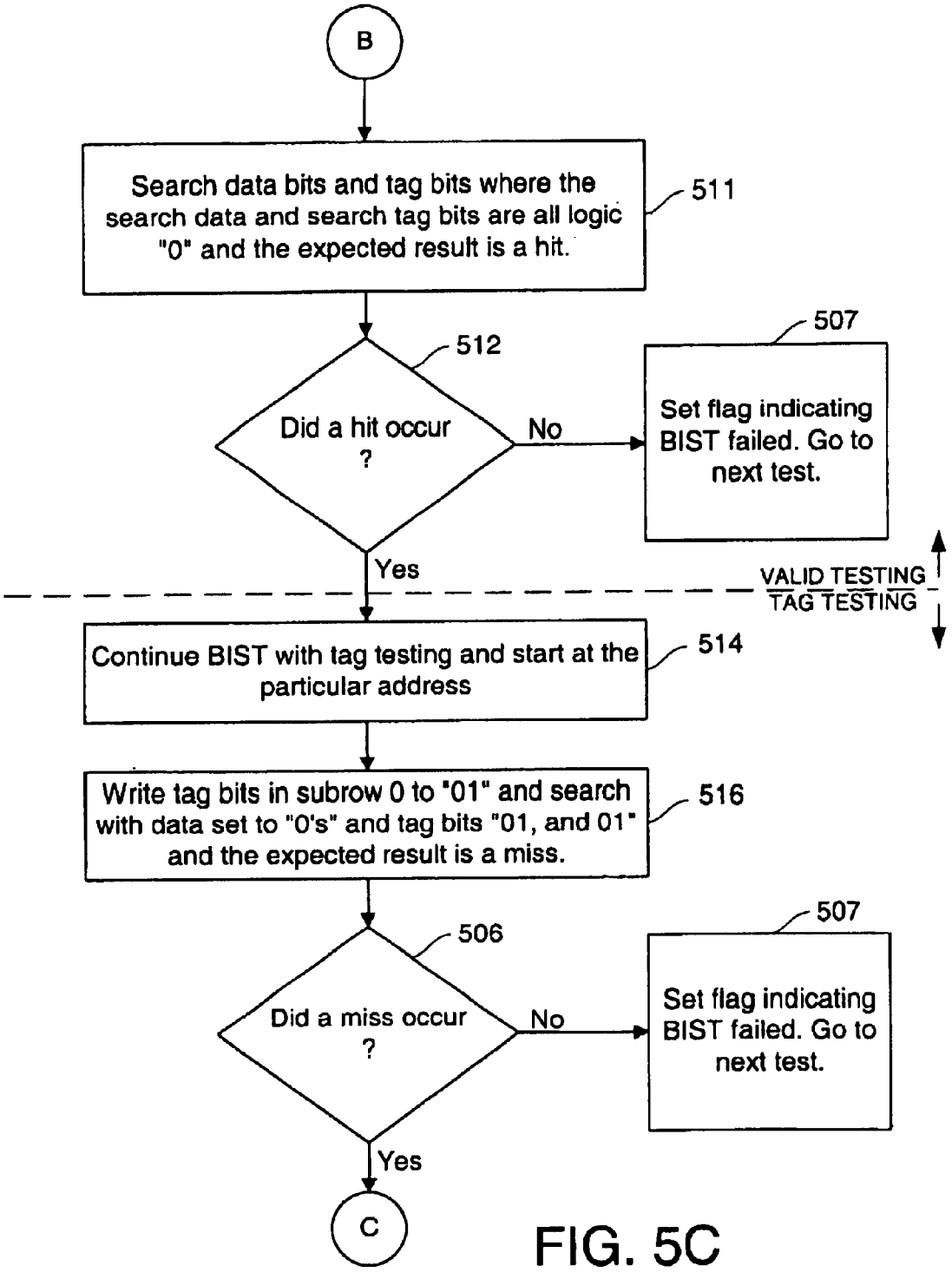
Figure 5D:
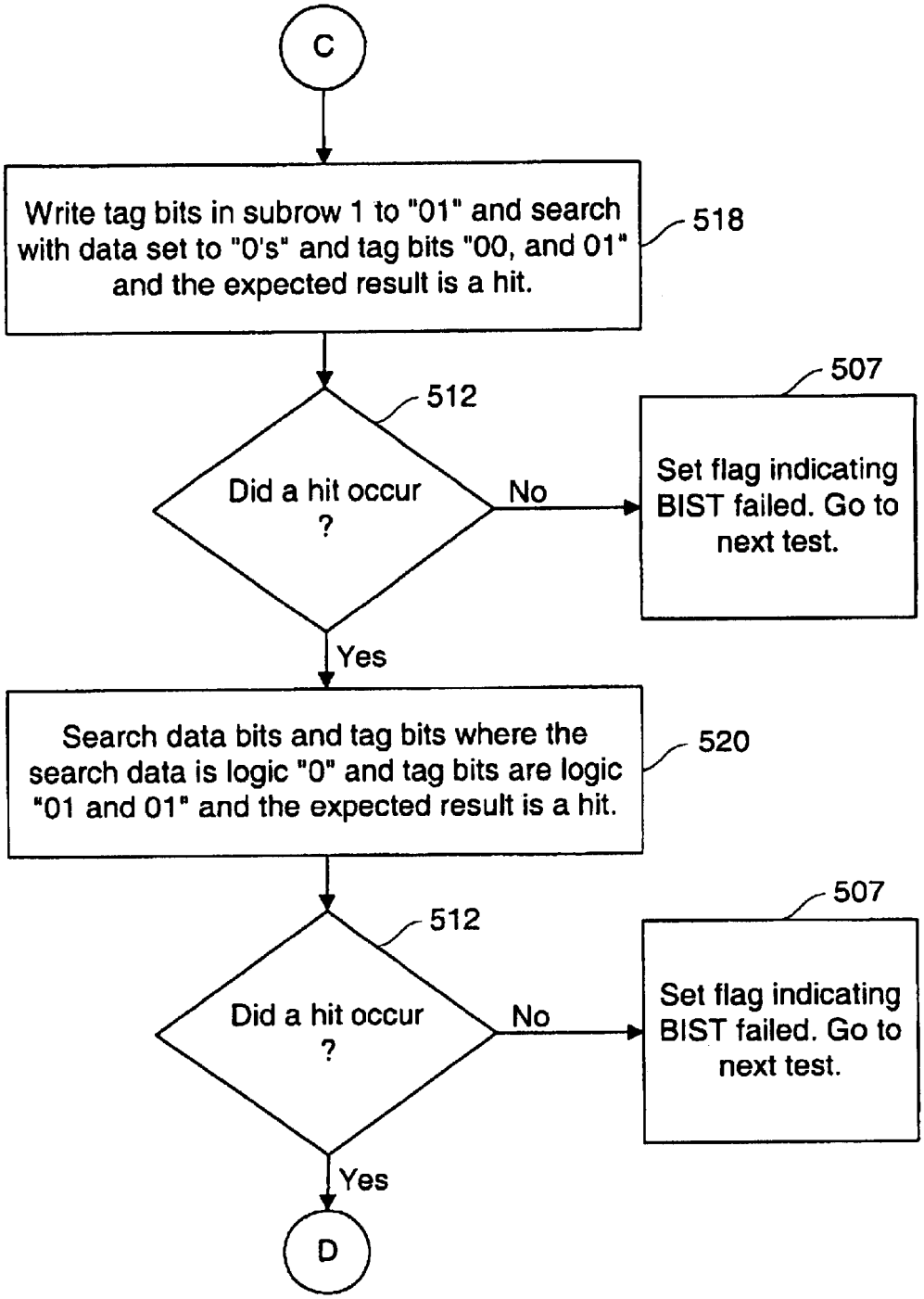
Figure 5E:
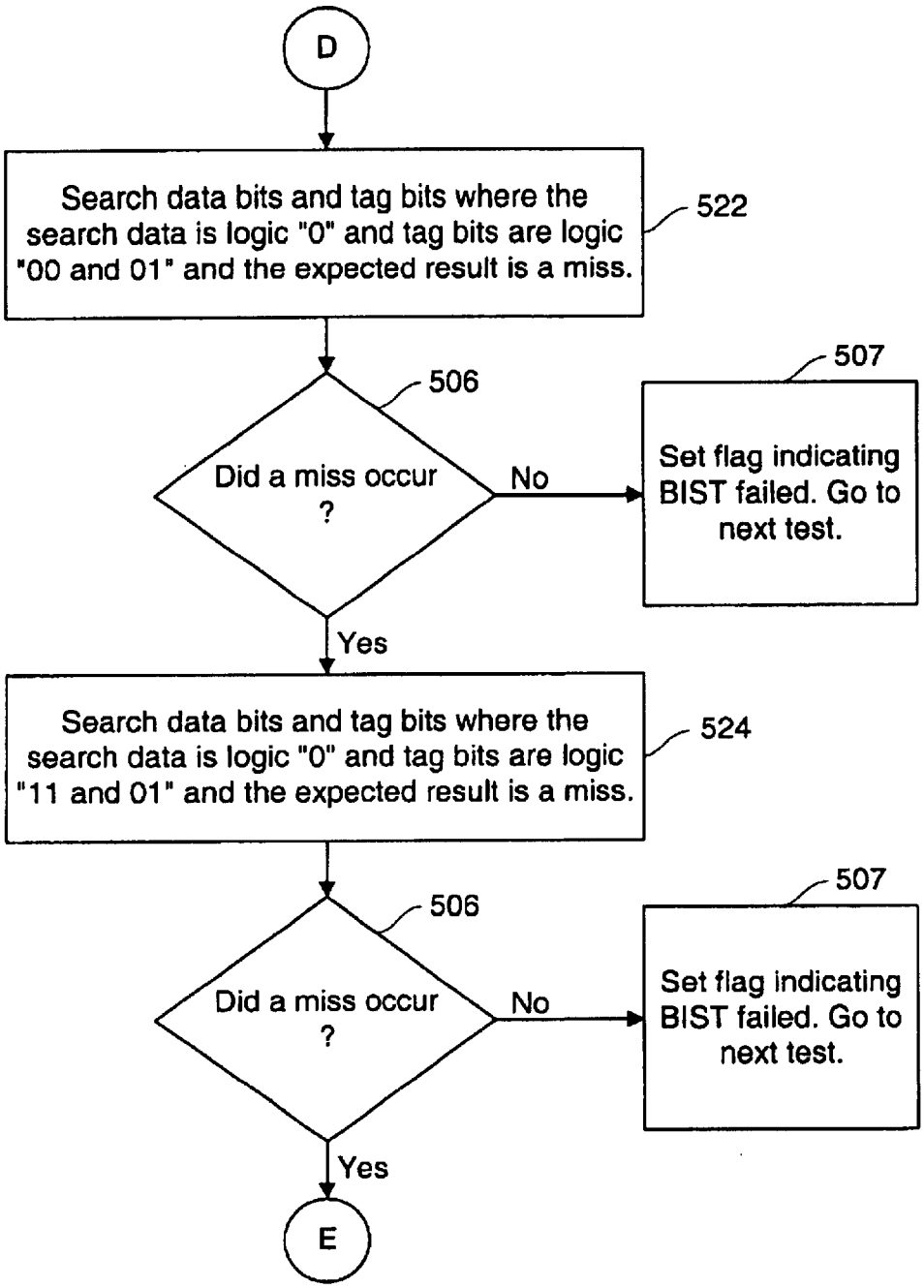
Figure 5F:
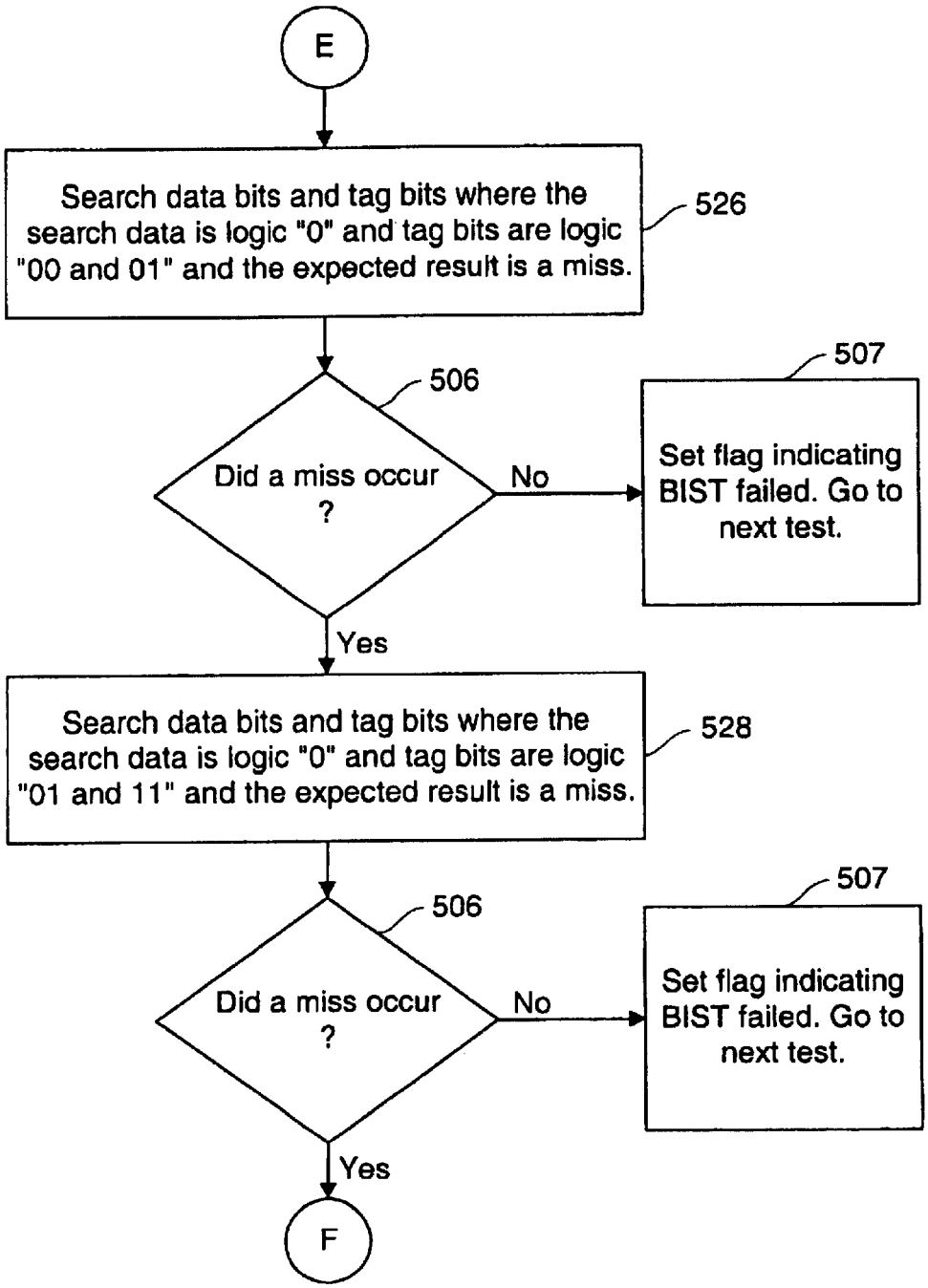
Figure 5G:
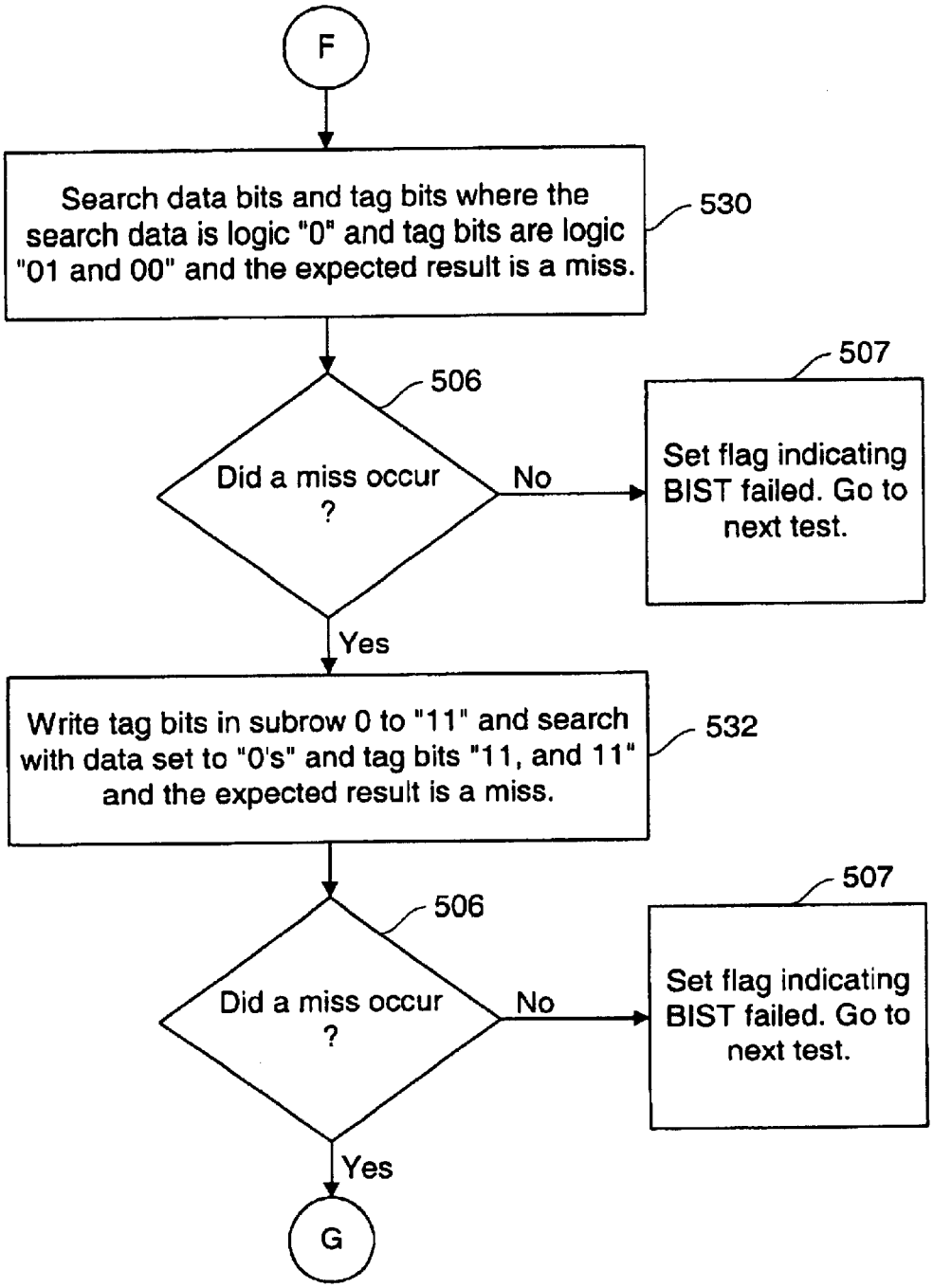
Figure 5H:
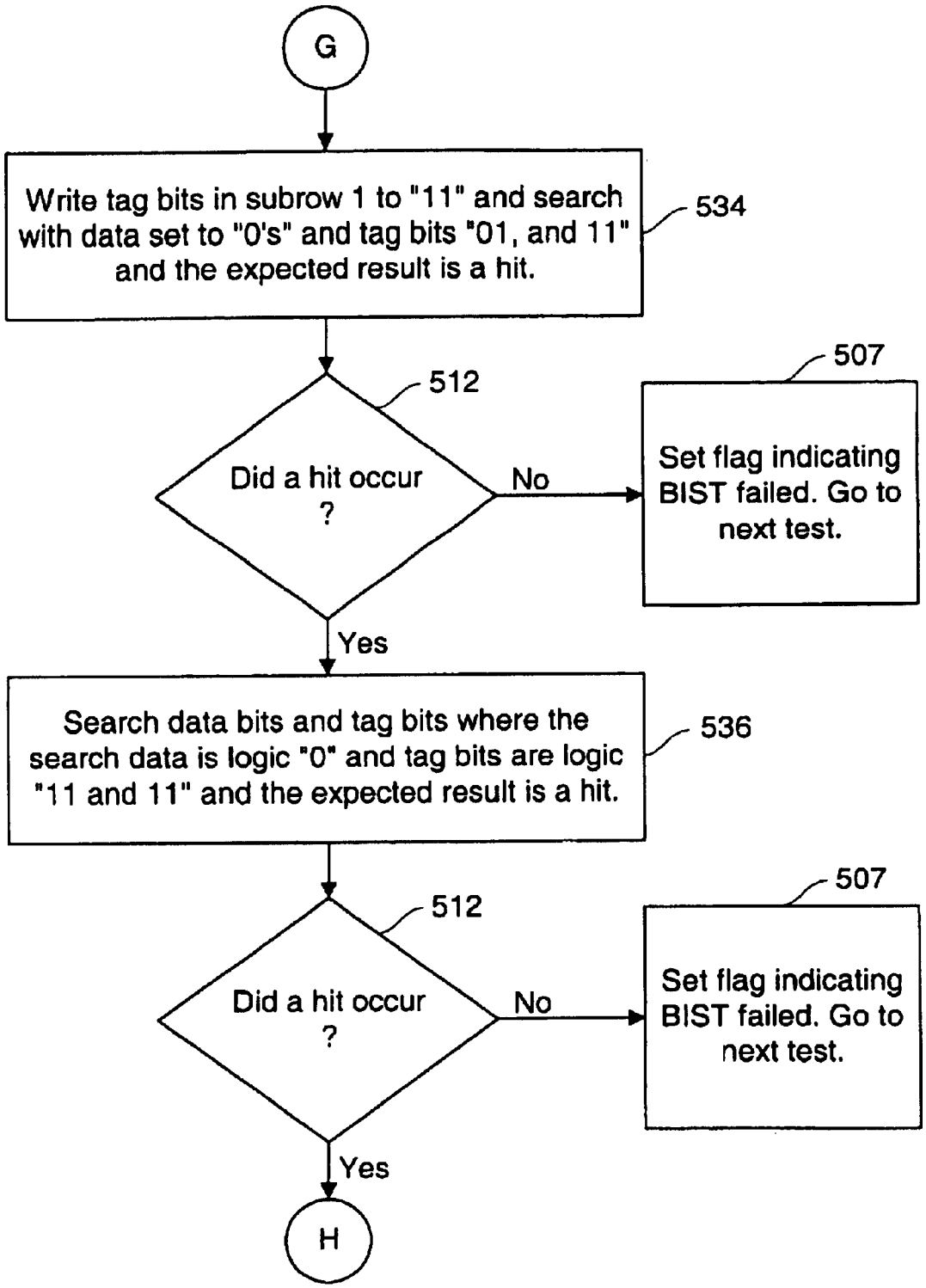

Once the flag is set, the method proceeds to the next operation and moves to A of FIG. 5B. At operation 508, a write of the logic 1 is performed to the valid bit of subrow 1, and simultaneously, a search is performed with the data and tag bits set at logic 0. The expected result will be a miss for operation 508. In operation 506, it is determined whether the miss occurred. If the miss did not occur as expected, the flag will be set indicating that the BIST test failed and the method will proceed to the next operation. Alternatively, if a miss did occur, the method will proceed to operation 510 where a search is performed for data bits and tag bits where the search data and search tag bits are all at logic 0, and the expected result will be a hit.

In response to the search of 510, the method will proceed to operation 512 where it is determined whether a hit occurred. If a hit does not occur as expected, a flag will be set indicating that the BIST test failed in operation 507. Otherwise, the method will proceed to B of FIG. 5C, and operation 511. In operation 511, a search of data bits and tag bits where the search data and search tag bits are all at logic 0, is performed and the expected result should be a hit. In operation 512, if it is determined that a hit occurred, the method will proceed to tag testing and operation 514. Otherwise, a flag will be set indicating that the BIST test failed in operation 507. As the method moves to operation 514, valid bit testing will be done and tag bit testing will begin.

In operation 514, BIST testing continues with tag testing which starts at the same particular address as the valid bit testing began. Now, the method moves to operation 516 where tag bits are written in subrow 0 to 01, and a search is performed with data set to 0's, and the tag bits set to 01 and 01. The expected result will be a miss. Accordingly, the method will move to operation 506 where it is determined whether a miss occurred. If a miss does not occur, the method will proceed again to operation 507 where the flag is set indicating that the BIST lest failed. Otherwise, if the miss did occur, the method proceeds to C of FIG. 5D and the operation 518. In operation 518, tag bits are written in subrow 1 to 01 and a search is performed with data set to 0's, and tag bits set to 00 and 01. The expected result will now be a hit. In operation 512, it is determined whether a hit occurred. If a hit does not occur, the flag will set indicating that the BIST testing failed. Otherwise, the method will move to an operation 520 where a search of data bits and tag bits is performed where the search data is logic 0, and the tag bits are logic 01 and 01. The expected result for the search should be a hit.

From operation 520, the method moves to a decision operation 512 where it is determined whether the hit occurred. If the hit does not occur, the flag will be set indicating that the BIST testing failed. Otherwise, the method will move to D of FIG. 5E, and operation 522. In operation 522, a search of data bits and tag bits is performed where the search data is set to logic 0, and the tag bits are set to logic 00 and 01, and the expected result is a miss. In operation 506, it is determined whether the miss occurred. If the miss did not occur, the method will move to operation 507 where a flag is set indicating that the BIST test failed. Otherwise, if the miss did occur, the method will proceed to operation 524. In operation 524, data bits and tag bits are searched where the search data is set to logic 0 and the tag bits are set to logic 11 and 01, and the expected result of the search will be a miss. From operation 524, the method moves to decision operation 506 where it is determined whether a miss occurred. If a miss did not occur, the method will move to operation 507 where a flag indicating that the BIST test failed to set. Otherwise, the method moves to E of FIG. 5F and operation 526. In operation 526, a search of data bits and tag bits is performed where the search data is logic 0, and the tag bits are logic 00 and 01. The expected result should be a miss.

In operation 506, it will be determined whether a miss occurred, and if no miss occurred, the flag will be set indicating that the BIST test failed. Otherwise, the method will move to operation 528. In operation 528, the search is performed of data bits and tag bits where the search data is logic 0, and the tag bits are logic 01 and 11. The expected result should be a miss. In operation 506, it is determined whether a miss occurred. If a missdid not occur, the method will move to operation 507 where a flag is set indicating that the BIST testing failed. If a miss did occur, the method will move to F and operation of 530 of FIG. 5G. In operation 530, a search is performed of data bits and tag bits where the search data is logic 0, and the tag bits are logic 01 and 00, and the expected result is a miss. If it is determined that a miss did not occur in operation 506, the method will move to operation 507, where a flag is set indicating that the BIST test failed. Otherwise, the method will move to operation 532 where tag bits in subrow 0 are written to 11 and the search is performed with data set to 0's and tag bits set to 11, and 11. The expected result will be a miss.

In operation 506, it will be determined whether the miss occurred. If the miss did not occur, the method again proceeds to operation 507 where a flag is set indicating that the BIST test failed. Otherwise, the method will move to G of FIG. 5H, and operation 534. In operation 534, tag bits are written in subrow 1 to 11, and a search is performed with the data set to 0, and the tag bits set to 01 and 11. The expected result will be a hit. If a hit does not occur in operation 512, the method will move to operation 507 where a flag is set indicating that the BIST test failed. If a hit does occur, the method proceeds to operation 536 where data bits and tag bits are searched, where the search data is logic 0 and the tag bits are logic 11 and 11, and the expected result is a hit. If a hit does not occur, the method will proceed again to operation 507 where a flag is set indicating that the BIST test failed. Otherwise, the method will move to H of FIG. 51 and operation 538. In operation 538, a search of data bits and tag bits is performed where the search data is logic 0 and the tag bits are logic 01 and 11, and the expected result is a miss. If a miss does not occur in operation 506, a flag is set indicating that the BIST testing failed in operation 507. Otherwise, the method will move to operation 540 where a search of data bits and tag bits is performed where the search data is logic 0, and the tag bits are logic 01 and 11. The expected result for this search should be a miss. If a miss does not occur, the flag will be set indicating that the BIST testing failed. Otherwise, the method will move to 1 of FIG. 5J and operation 542.

In operation 542, a search is performed of data bits and tag bits where the search data is logic 0, and the tag bits are logic 10 and 11. The expected results should be a miss. If a miss does not occur, the flag will be set indicating that the BIST testing failed in operation 507. Otherwise, the method will move to operation 544 where a search of data bits and tag bits is performed where the search data is logic 0, and the tag bits are logic 11 and 01, and the expected result is a miss. If a miss does not occur, the method will move to operation 507 where a flag is set indicating that BIST test failed. Otherwise, the method will move to J of FIG. 5K and operation 546. In operation 546, a search is performed of data bits and tag bits where the search data is logic 0 and the tag bits are logic 11 and 10, and the expected result is a miss. If a miss does not occur, the method will proceed to operation 507 where a flag is set indicating the BIST testing failed. Otherwise, if a miss does occur, the method will proceed to operation 548 where a writing of tag bits in subrow 0 to 10, and a search is performed with data set to 0's and the tag bits set to 10 and 10. The expected result should be a miss. If a miss does not occur, the flag will be set indicating that the BIST test failed. If miss does occur, the method will move to K of FIG. 5L and operation 550.

In operation 550, tag bits are written in subrow 1 to 10 and a search is performed with data set to 0's, and tag bits set to 11 and 10, and the expected result is a hit. In operation 512, it is determined whether a hit occurred. If a hit does not occur, this flag will be set indicating that the BIST test failed. Otherwise, the method will proceed to operation 552 where a search of data bits and tag bits is performed where the search data is logic 0, and the tag bits are logic 10 and 10. The expected result should be a hit. If a miss does not occur in operation 506, the method will proceed to operation 507 where a flag is set indicating that the BIST test failed. Otherwise, the method will proceed to L of FIG. 5M in operation 554.

In operation 554, a search if performed for data bits and tag bits where the search data is logic 0, and the tag bits are logic 11 and 10, and the expect result is a miss. If a miss does not occur, the flag will be set indicating that the BIST test failed. Otherwise, the method will proceed to operation 556 where a search of data bits and tag bits is performed where the search data is logic 0, and the tag bits are logic 00 and 10. The expected result will be a miss. If a miss does not occur in operation 506, the flag will be set indicating that the BIST test failed, otherwise, the method will proceed to operation 557 where a search of data bits and tag bits is performed where the search data is logic 0 and the tag bits are logic 11 and 10. The expected result should be a miss. If a miss does not occur in operation 506, the method will proceed to operation 507 where a flag is set indicating the BIST has failed. Otherwise, the method will proceed to M of FIG. 5N and operation 558. In operation 558, a search is performed of data bits and tag bits where the search data is logic 0, and the tag bits are logic 10 and 00. The expected result should be a miss. If a miss does not occur in operation 506, the method will proceed to operation 507 where a flag is set indicating that the BIST testing failed. Otherwise, the method will proceed to operation 560 where a search of data bits and tag bits is performed for the search data is logic 0, and the tag bits are logic 10 and 11. The expected result should be a miss. If a miss does not occur, the method will proceed to 507 where a flag is set indicating that the BIST testing failed. Otherwise, the method will proceed to N of FIG. 5O and operation 562.

In operation 562, tag bits are written in subrow 0 to 00, and a search is performed with the data set to 0's and the tag bits set to 00 and 00. The expected result should be a miss. If a miss does not occur, the method will proceed to operation 507 where a flag is set indicating that the BIST test failed. Otherwise, the method will proceed to operation 564. In operation 564, tag bits are written in subrow 1 to 00, and a search is performed with the data set to 0's, and the tag bits set to 10 and 00, where the expected result is a hit. If a hit does not occur, the method will proceed to operation 507 where a flag is set indicating that the BIST test failed. Otherwise, the method will proceed to O of FIG. 5P and operation 566. In operation 566, a search is performed of data bits and tag bits where the search data is logic 0 and the tag bits are logic 00 and 00. The expected result is a hit. If it is determined that a hit does not occur in operation 512, the method will proceed to operation 507 where a flag is set indicating that the BIST test failed.

If a hit did occur, the method proceeds to operation 568 where a search is performed of data bits and tag bits where the search data is logic 0, and the tag bits are logic 10 and 00, and the expected result is a miss. If the result is not a miss, the method will move to operation 507 where the flag is set indicating that the. BIST test failed. Otherwise, the method will proceed to P of FIG. 5Q and operation 570. In operation 570, a search will be performed of data bits and tag bits where the search data is logic 0 and the tag bits are logic 10 and 00. The expected result will be a miss. If a miss does not occur in operation 506, the method will proceed to an operation 507 where a flag is set indicating that the BIST test failed. If a miss does occur, the method will proceed to operation 572 where a search is performed of data bits and tag where the search data is logic 0, and the tag bits are logic 01 and 00, and the expected result is a miss. If a miss does not occur, the flag will be set indicating that the BIST test failed in operation 507. Otherwise, the method will proceed to Q of FIG. 5R and operation 574.

In operation 574, a search will be performed of data bits and tag bits where the search data is logic 0, and the tag bits are logic 00 and 10. The expected result will be a miss. If a miss does not occur, the method will proceed to operation 507 where a flag is set indicating that the BIST test failed. Otherwise, the method will proceed to an operation 576 where a search will be performed of data bits and tag bits where the search data is logic 0, and the tag bits are logic 00 and 01. The expected result should be a miss. If a miss does not occur, the flag will be set in operation 507 indicating that BIST test failed. Otherwise, the method will proceed to R of FIG. 5S. At this point, tag testing will be complete.

Figure 5I:
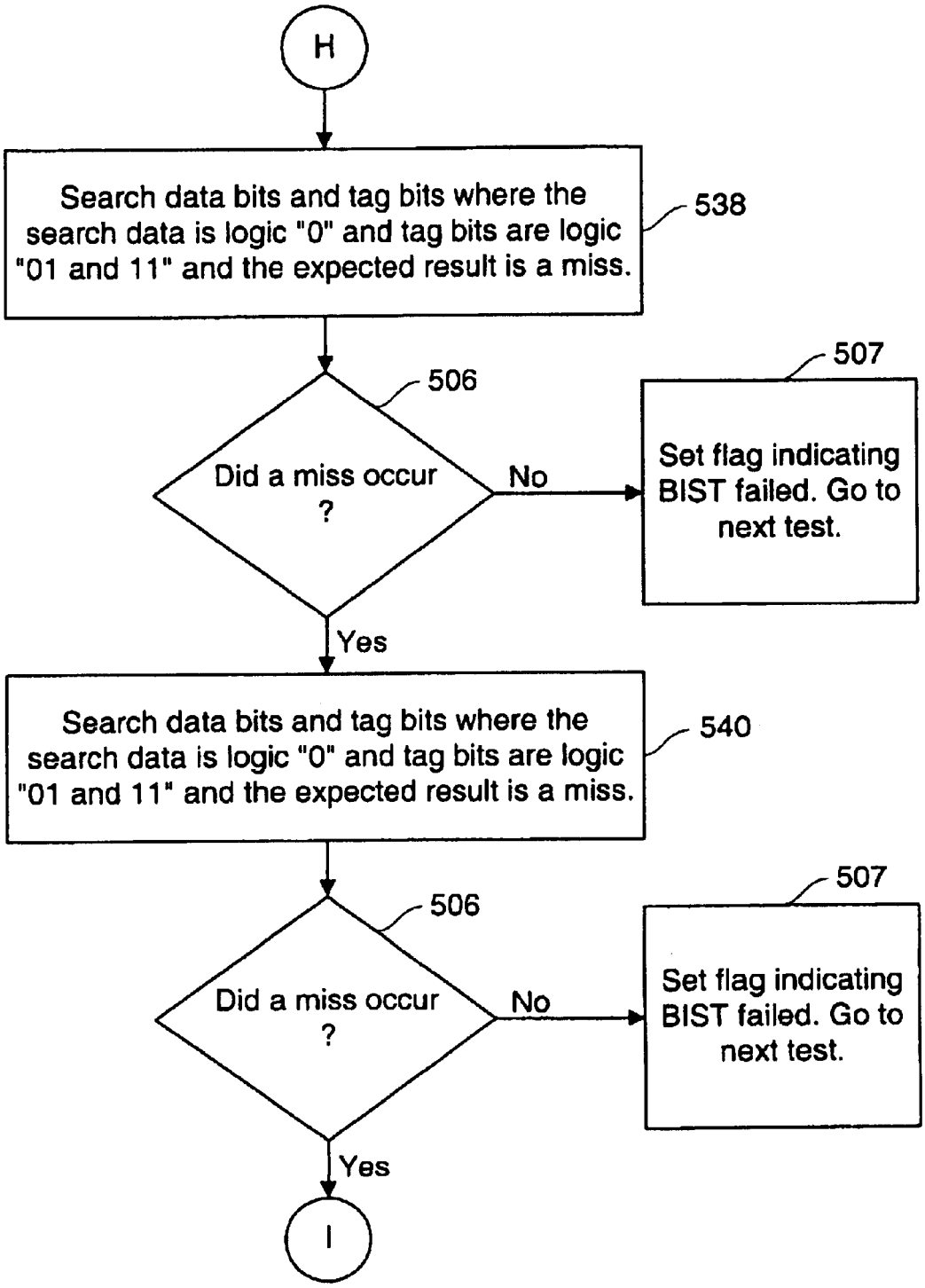
Figure 5J:
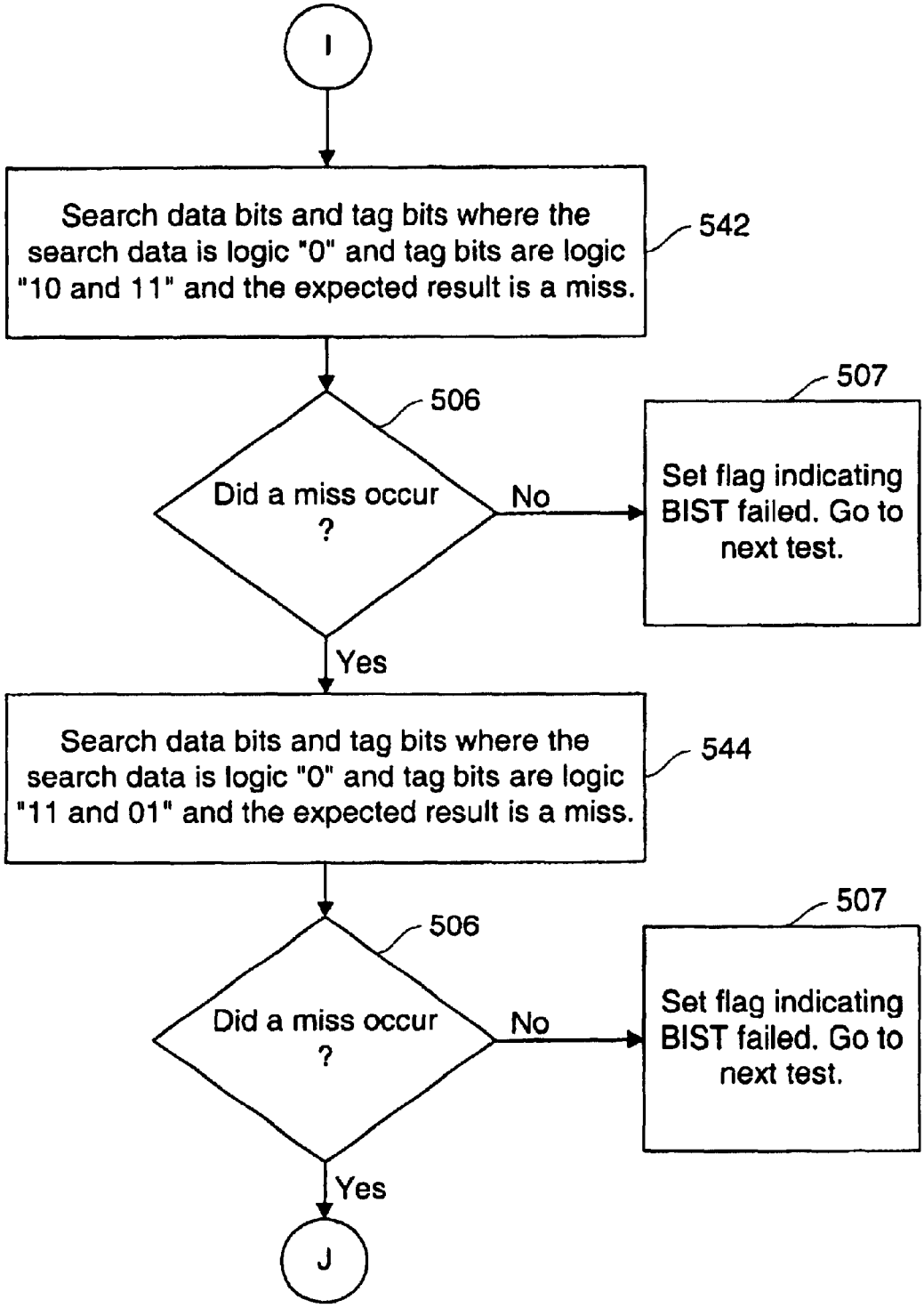
Figure 5K:
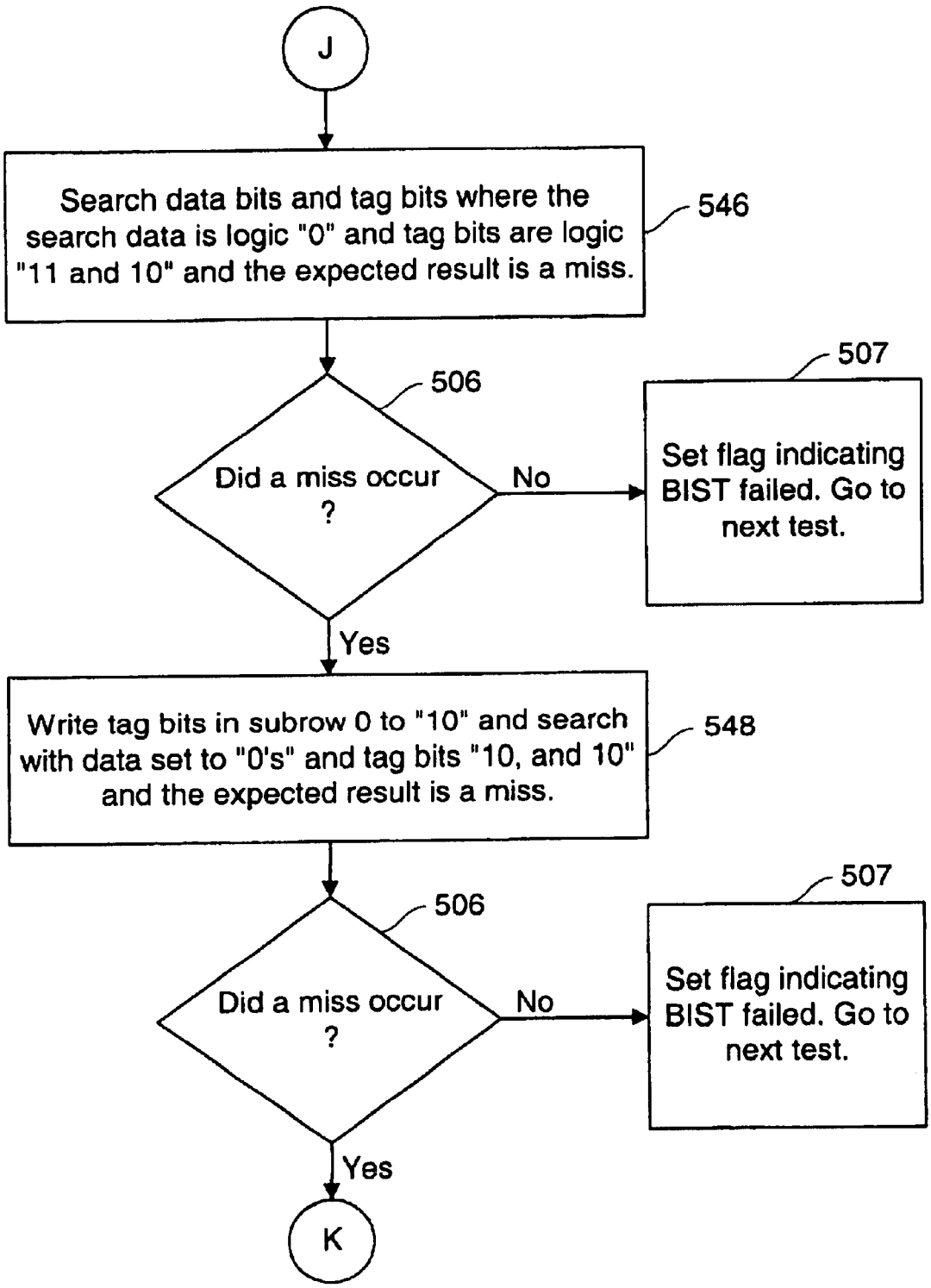
Figure 5L:
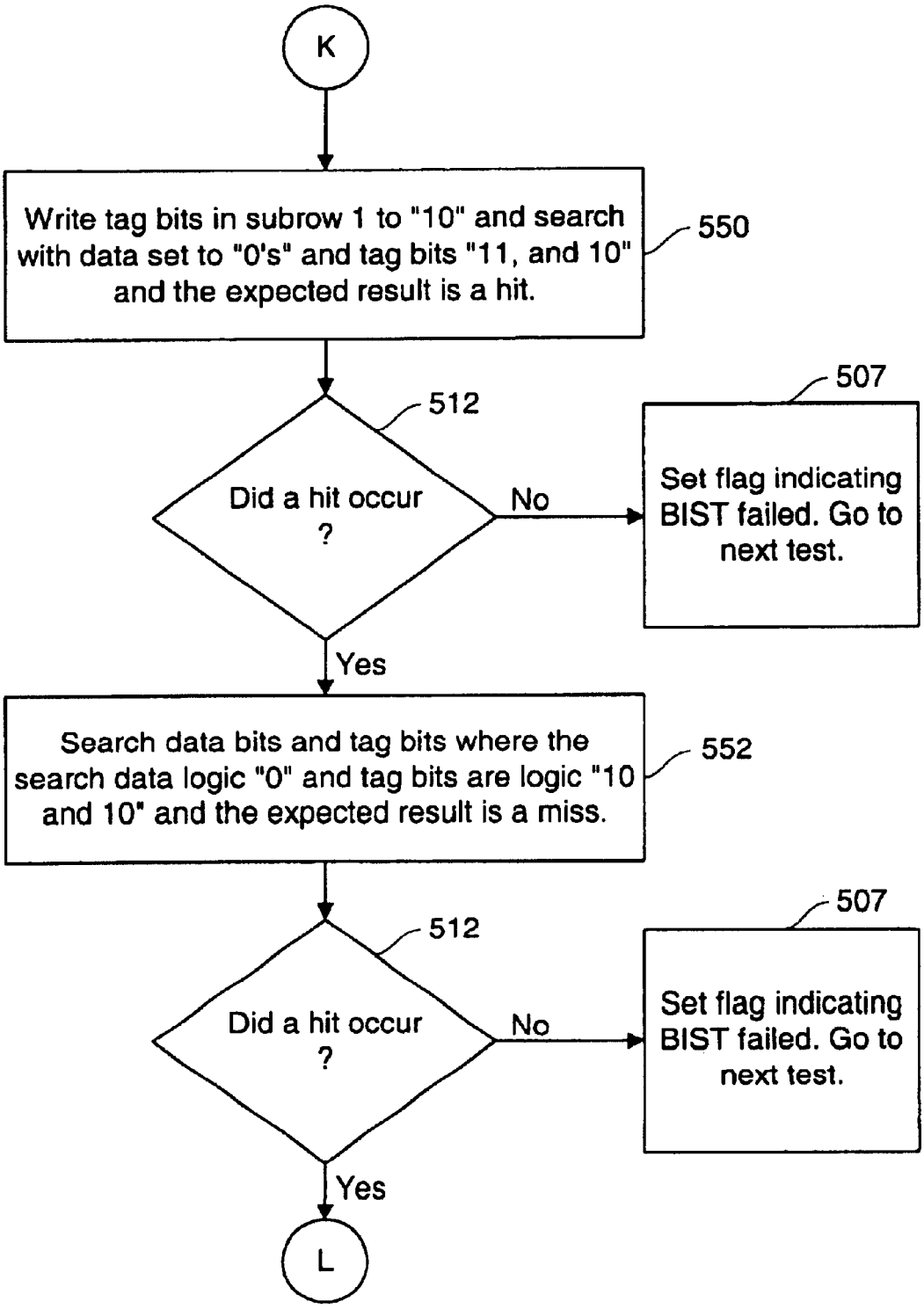
Figure 5M:
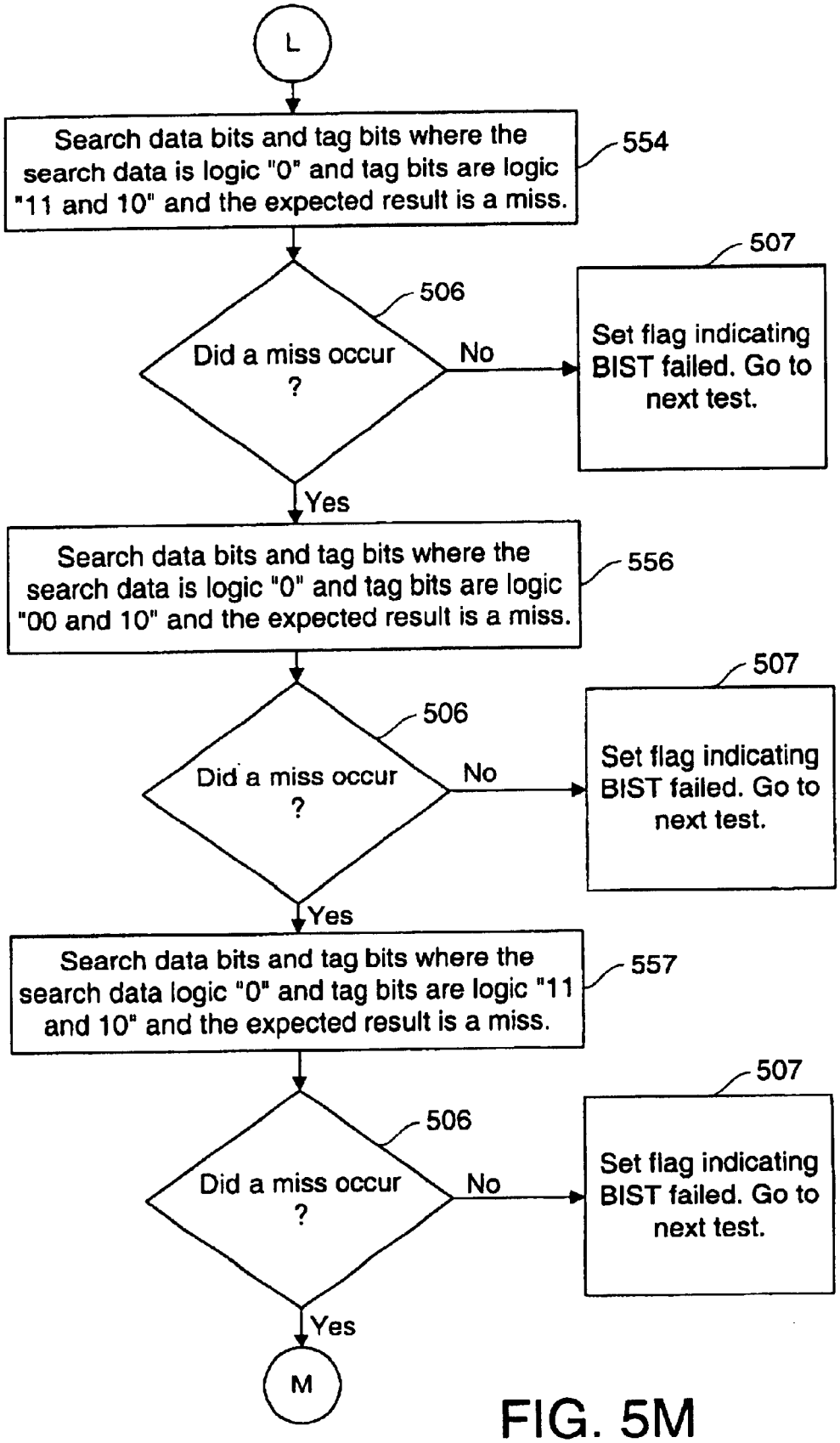
Figure 5N:
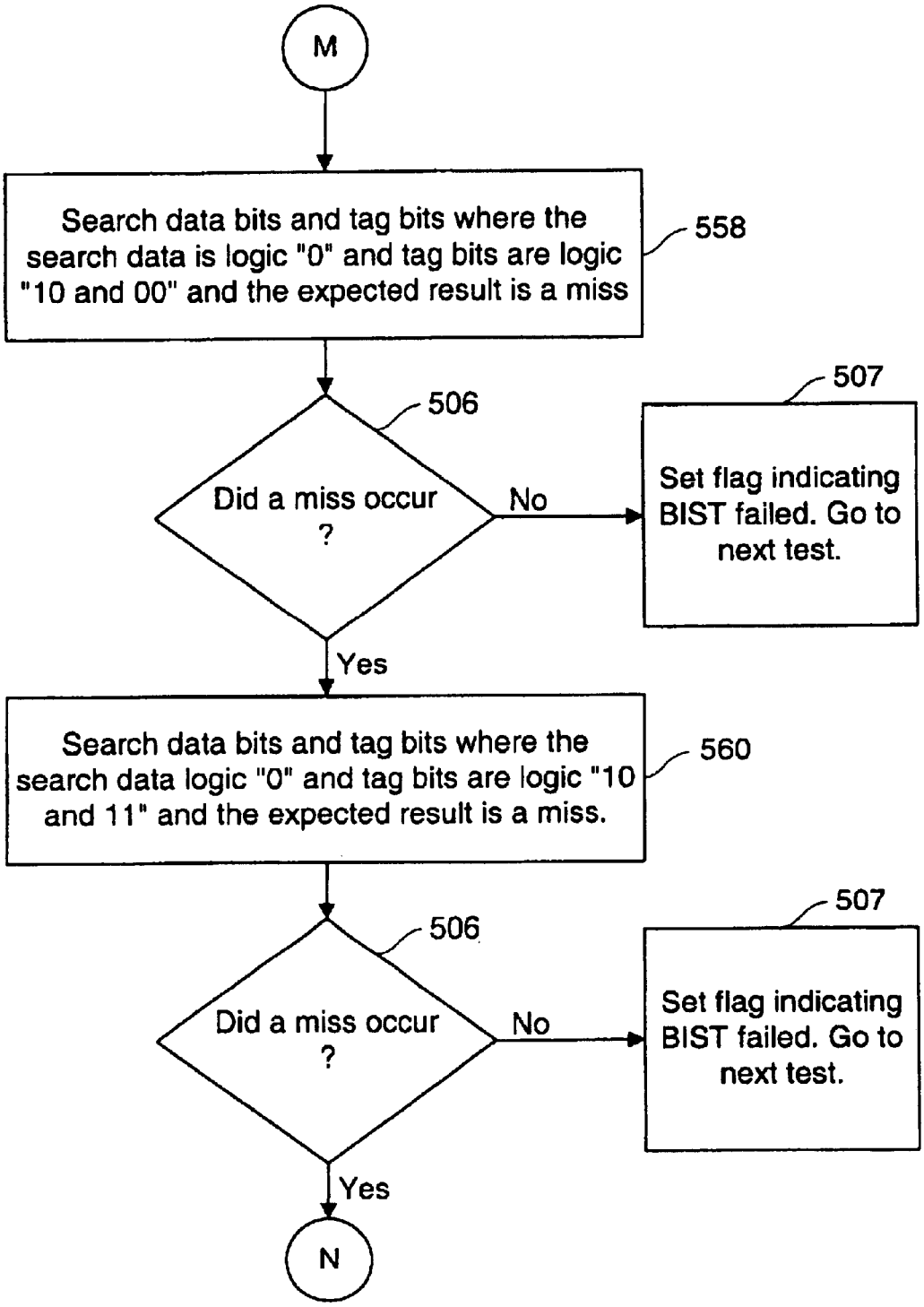
Figure 5O:
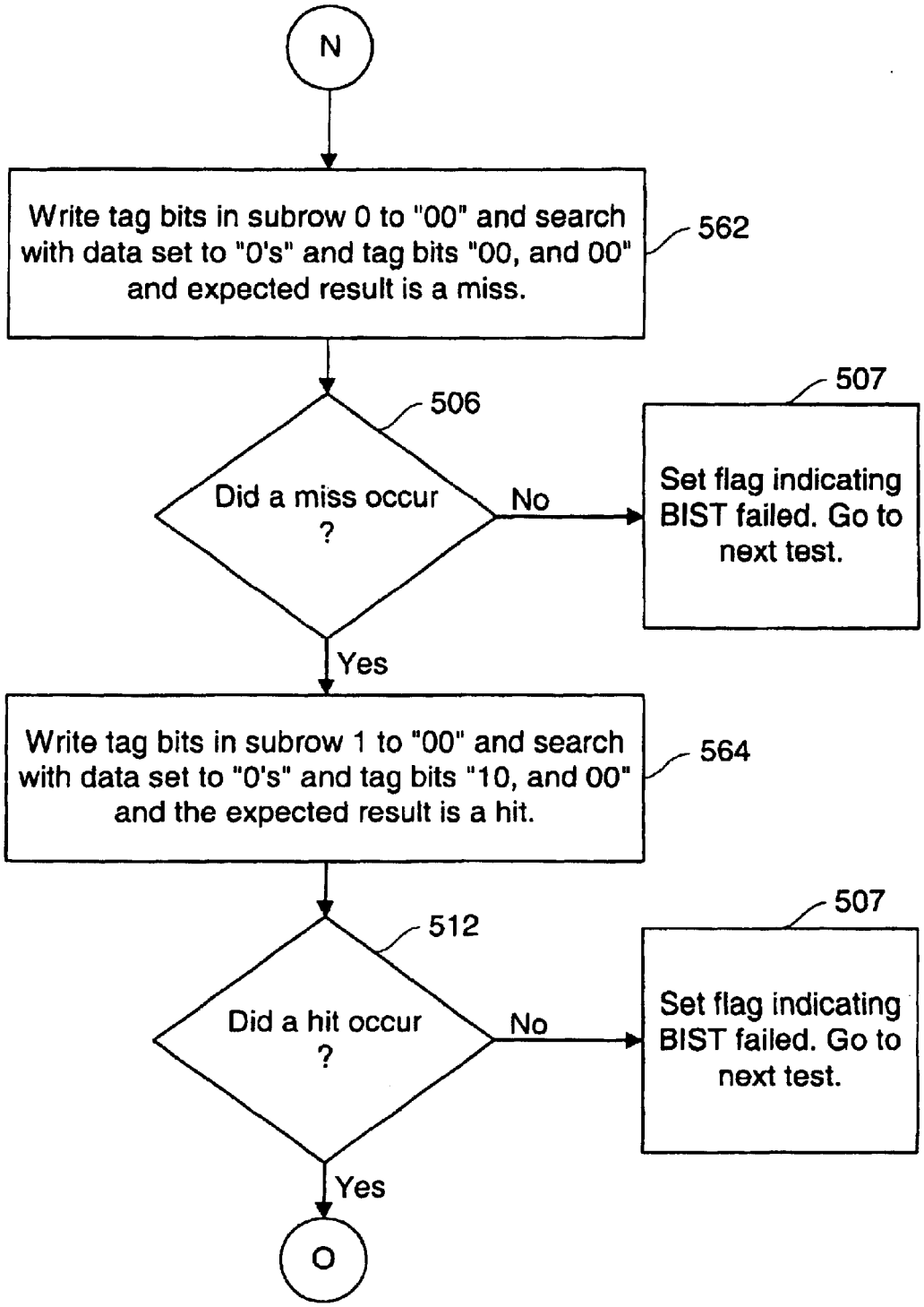
Figure 5P:
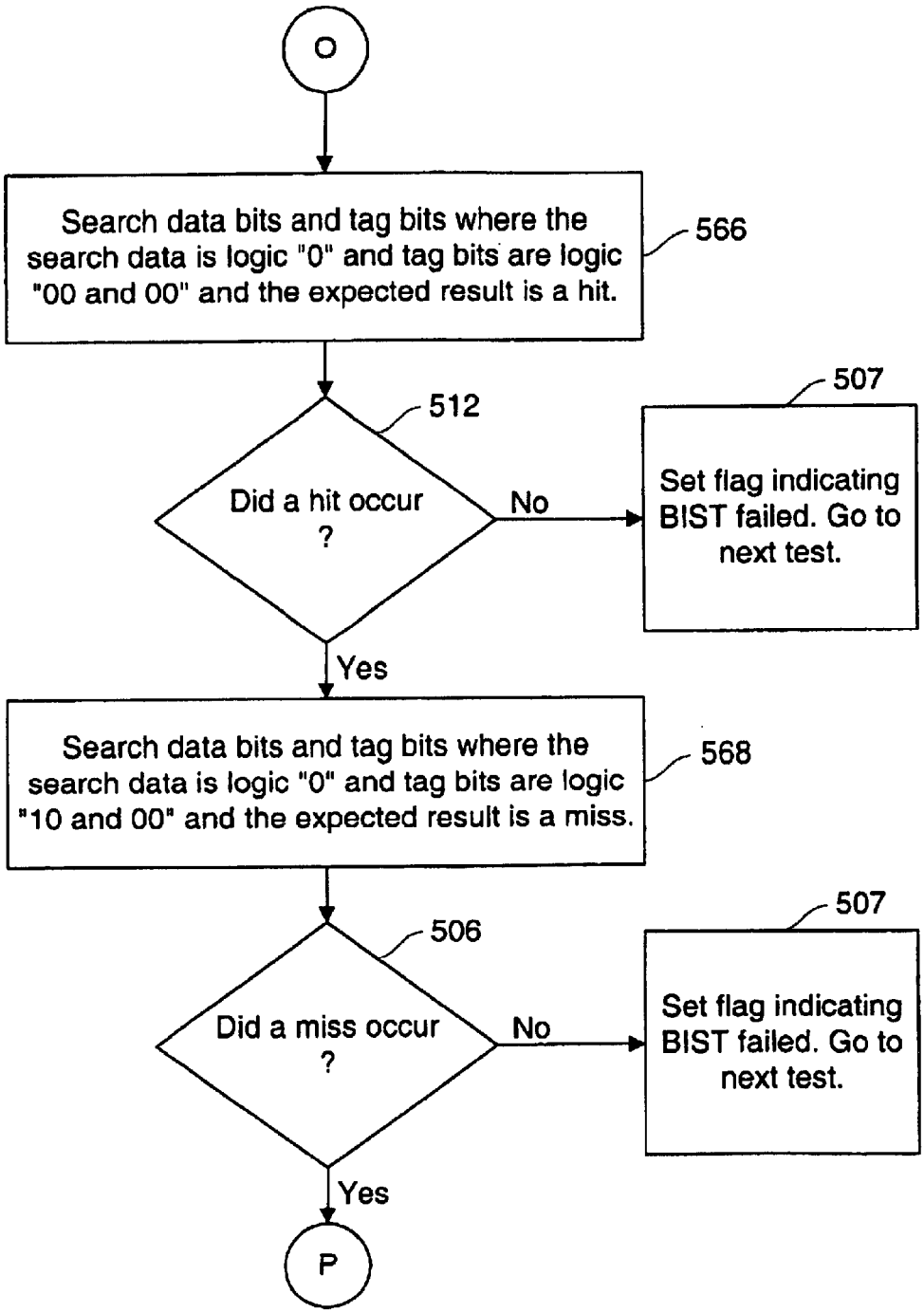
Figure 5Q:
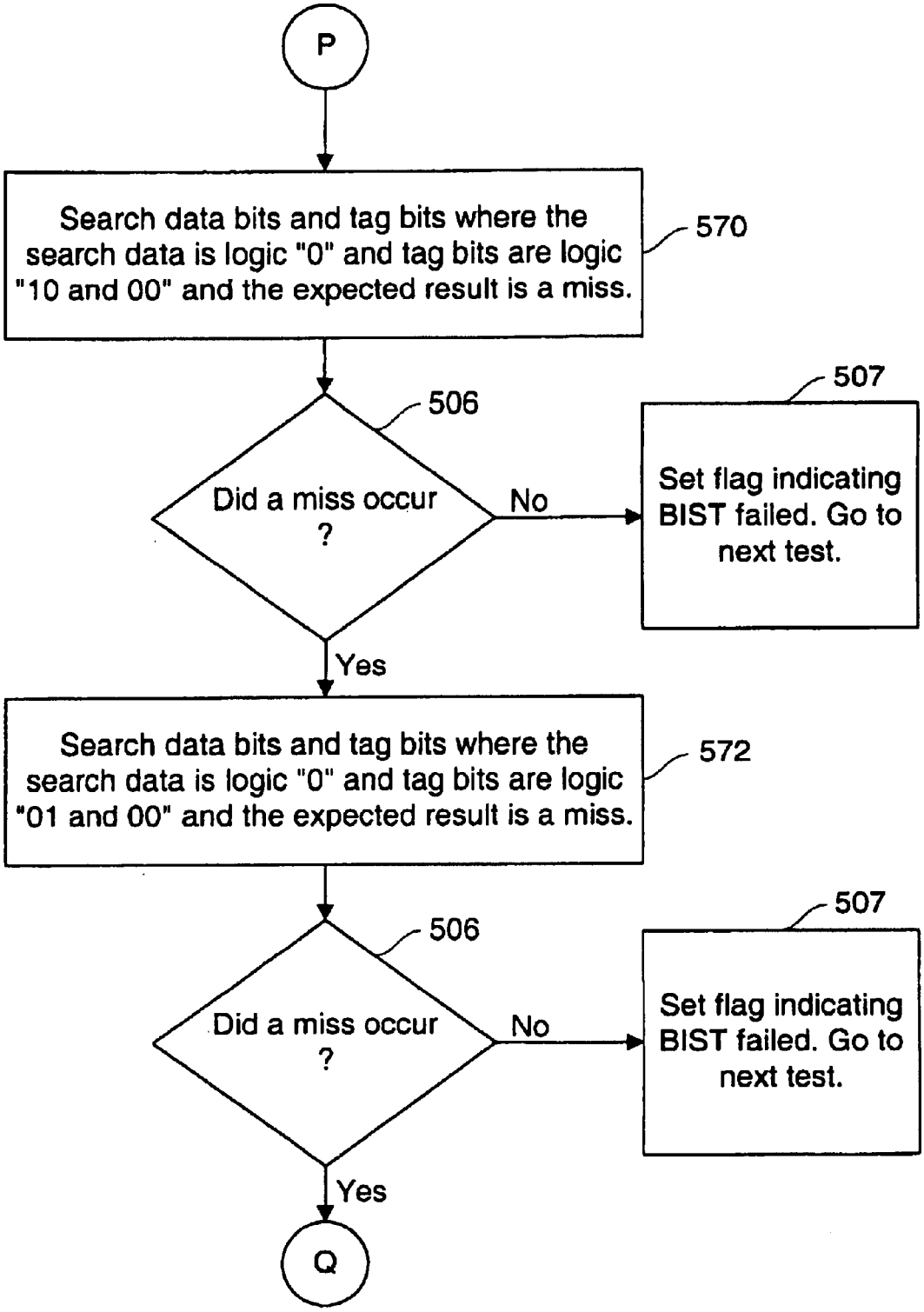
Figure 5R:
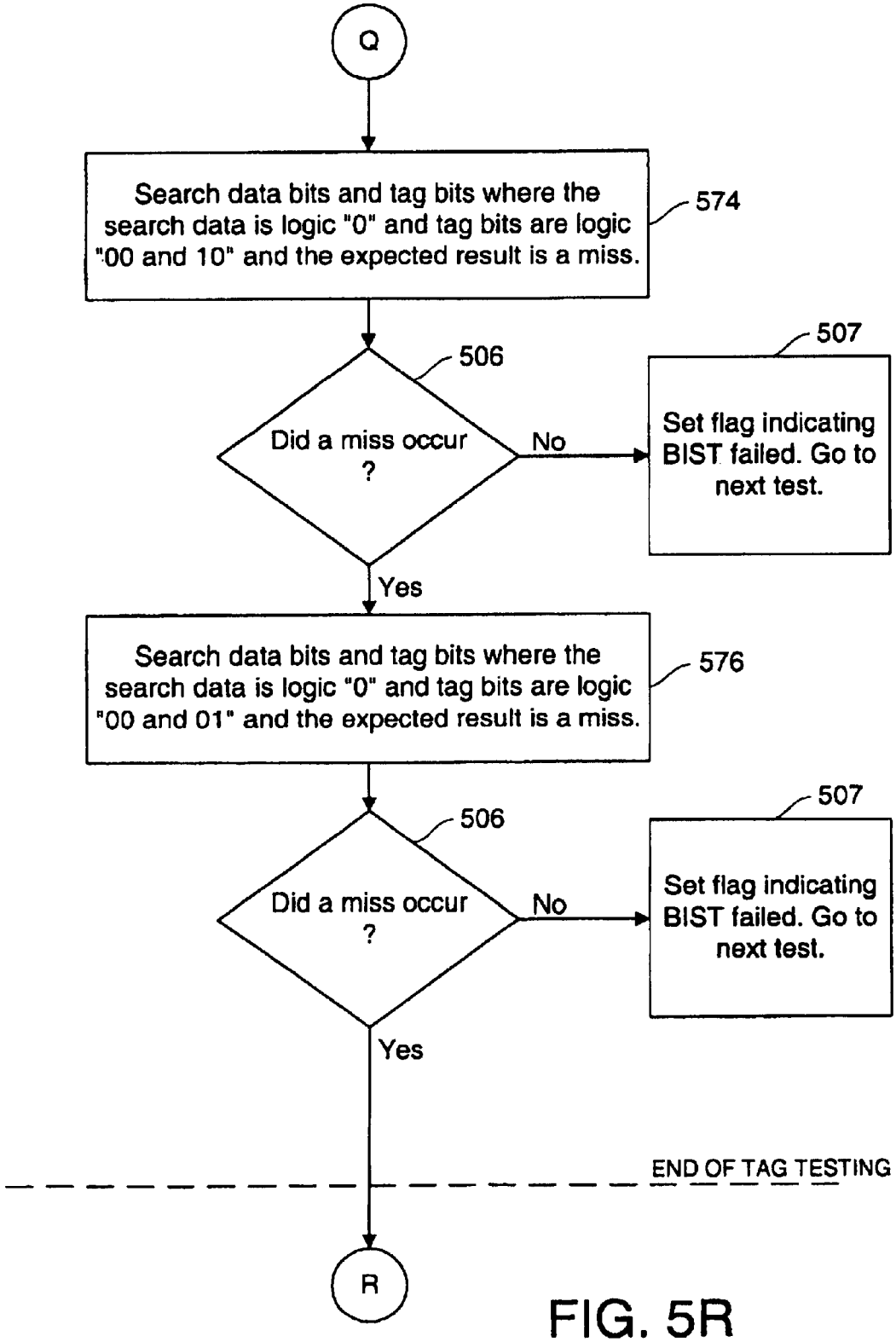
Figure 5S:
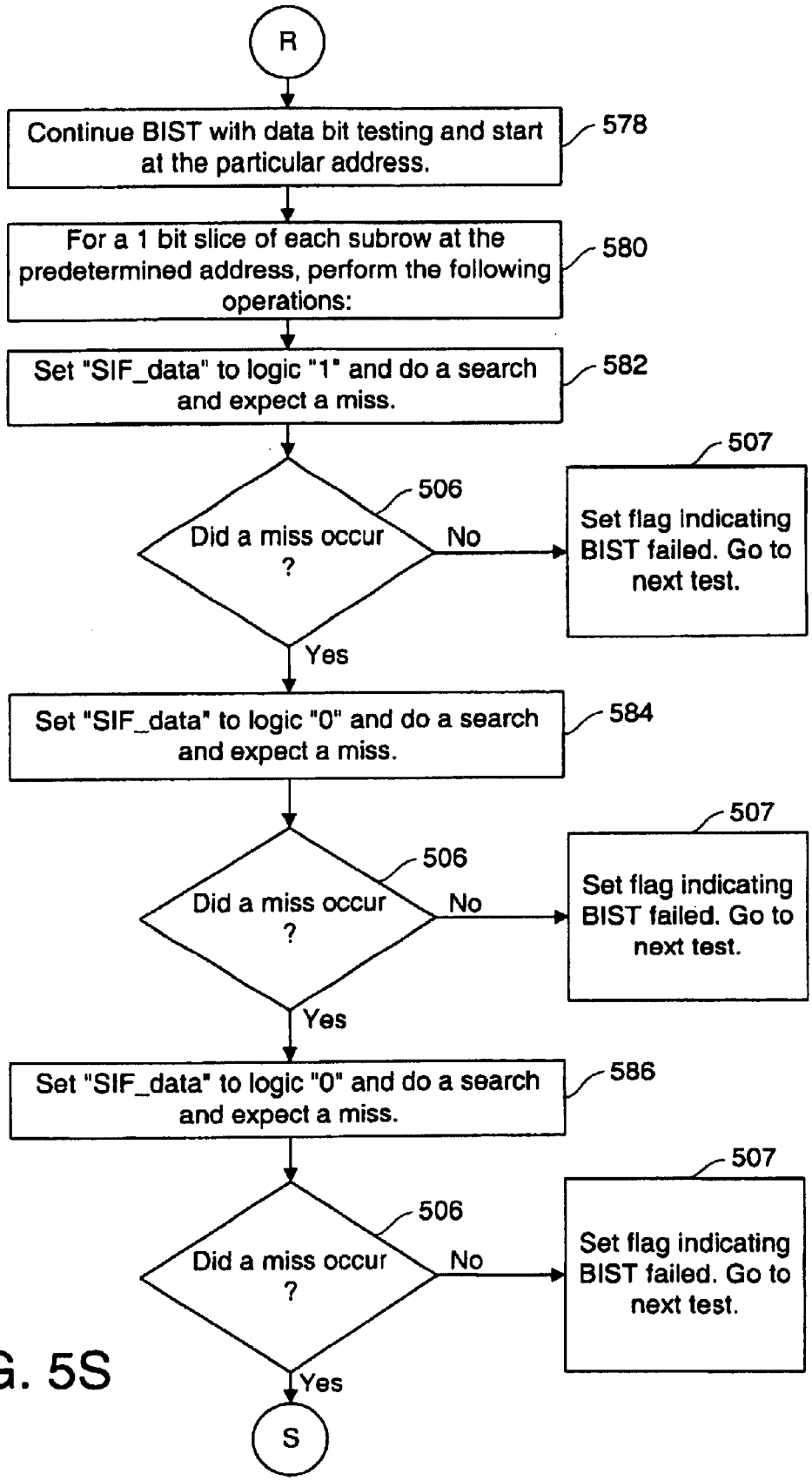
Figure 5T:
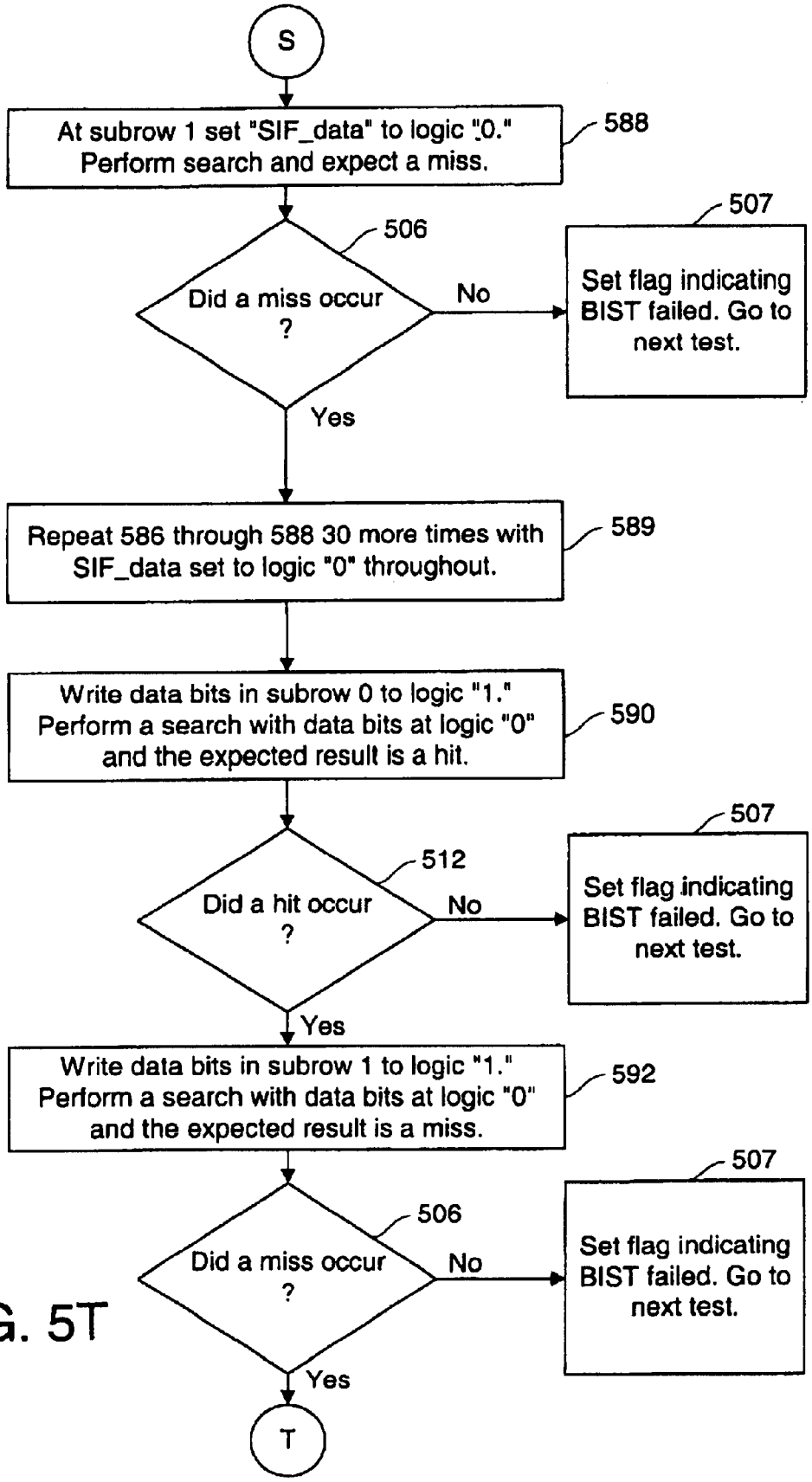
Figure 5U:
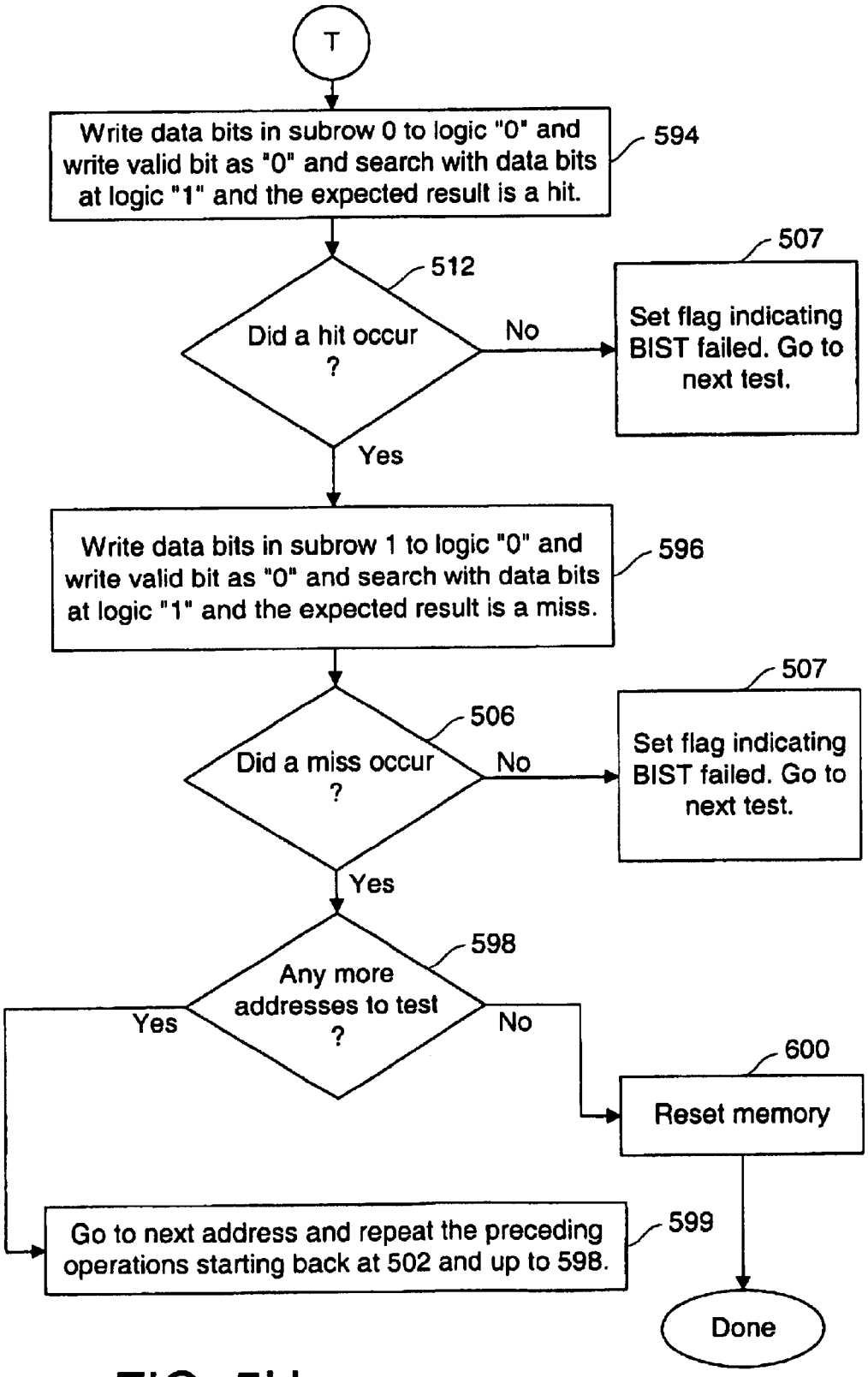

The method now moves to R of FIG. 5S where BIST testing will continue with data bit testing, and the testing will start at the particular address in operations 578. As mentioned above, the particular address should be the same address at which valid bit testing and tag bit testing began as described above. The method now moves to operation 580 where the following operations are performed for a 1 bit slice of each subrow at the pre-determined address.

In operation 582, "SIF_data" is set to logic 1 and a search is performed simultaneously. A miss is expected in operation 582. The method now moves to operation 506 where it is determined whether a miss occurred. If a miss does not occur, the flag is set indicating that the BIST test failed. Otherwise, the method moves to operation 584 where "SIF_data" is set to logic 0, and a search is simultaneously performed expecting a miss. If it is determined in operation 506 that a miss did not occur, the method proceeds to operation 507 where a flag is set indicating that the BIST test failed. Otherwise, the method moves to operation 586 where "SIF_data" is set to logic 0, and a search is performed expecting a miss. If a miss does not occur, the flag will be set indicating that the BIST test failed in operation 507. If a miss did occur, the method moves to S of FIG. 5P and operation 588.

In operation 588, "SIF_data" is set to logic 0. At the same time, a search is performed and a miss will be expected. In operation 506, it is determined whether the miss occurred. If a miss did not occur, a flag will be set indicating that BIST test failed in operation 507. If a miss did occur, the method will move to operation 589 where the method will repeat operations 586 through 588 "30" more times with SIF_data set to 0 throughout. This is performed 30 more times since each search word is 64 bits long, and operations 582 through 588 together with operation 589 have the effect of walking a 1 through a background of zeros in the search data. Of course, if the words were of different sizes, this operation would be repeated as many times as needed to operate on all data bits.

Once these operations have been repeated, the method will move to operation 590 where data bits are written in subrow 0 to logic 1. At the same time, a search is performed with the data bits at logic 0, and the expected results being a hit. In operation 512, it is determined whether a hit occurred. If a hit did not occur, the flag is set indicating that the BIST test failed. Otherwise, the method will move to operation 592 where data bits are written in subrow 1 to logic 1, and a search is simultaneously performed with the data bits at logic 0, and the expected result being a miss. If a miss did not occur, the flag will be set indicating that the BIST test failed. Otherwise, the method will move to P of FIG. 5U and operation 594. In operation 594, data bits are written in subrow 0 to logic 0, and the valid bit is written as 0, and a search is performed with the data bits at logic 1, and the expected result is a hit.

If a hit does not occur, the method will move to operation 507 where the flag is set indicating that the BIST test failed. Otherwise, the method will move to operation 596. In operation 596, data bits are written in subrow 0 to logic 0, and the valid bit is written as 0, and the search is performed with the data bits at logic 1, and the expected result being a miss. If a miss did not occur, the method moves to 507 where the flag is set indicating that the BIST test failed. If a miss did occur, the method moves to operation 598 where it is determined if there are anymore addresses to test. If there are more addresses to test, the method will go to operation 599 where the method proceeds to the next address and repeats the preceding operations starting at 502 and ending at 598. If all of the memory addresses have been tested, then the method will move to operation 600 where the memory is reset and the method will end.

As mentioned above, the algorithm is configured to perform BIST testing on one row at a time. This is enabled by making only the row being tested "valid," thus enabling searches during testing only in the valid rows. Of course, a search will always be performed over the entire CAM core, although, testing for matches will only occur in the valid row. This provides a substantial savings in power, thus making the BIST testing a low power test. Furthermore, the BIST testing executed by the BIST controller is capable of operating searches through the search port at the same time as writes are performed through the maintenance port. This, as mentioned above, improves testing efficiency in that searches can be executed at every cycle, and thus searches need not be stopped to enable writes.

Figure 6:
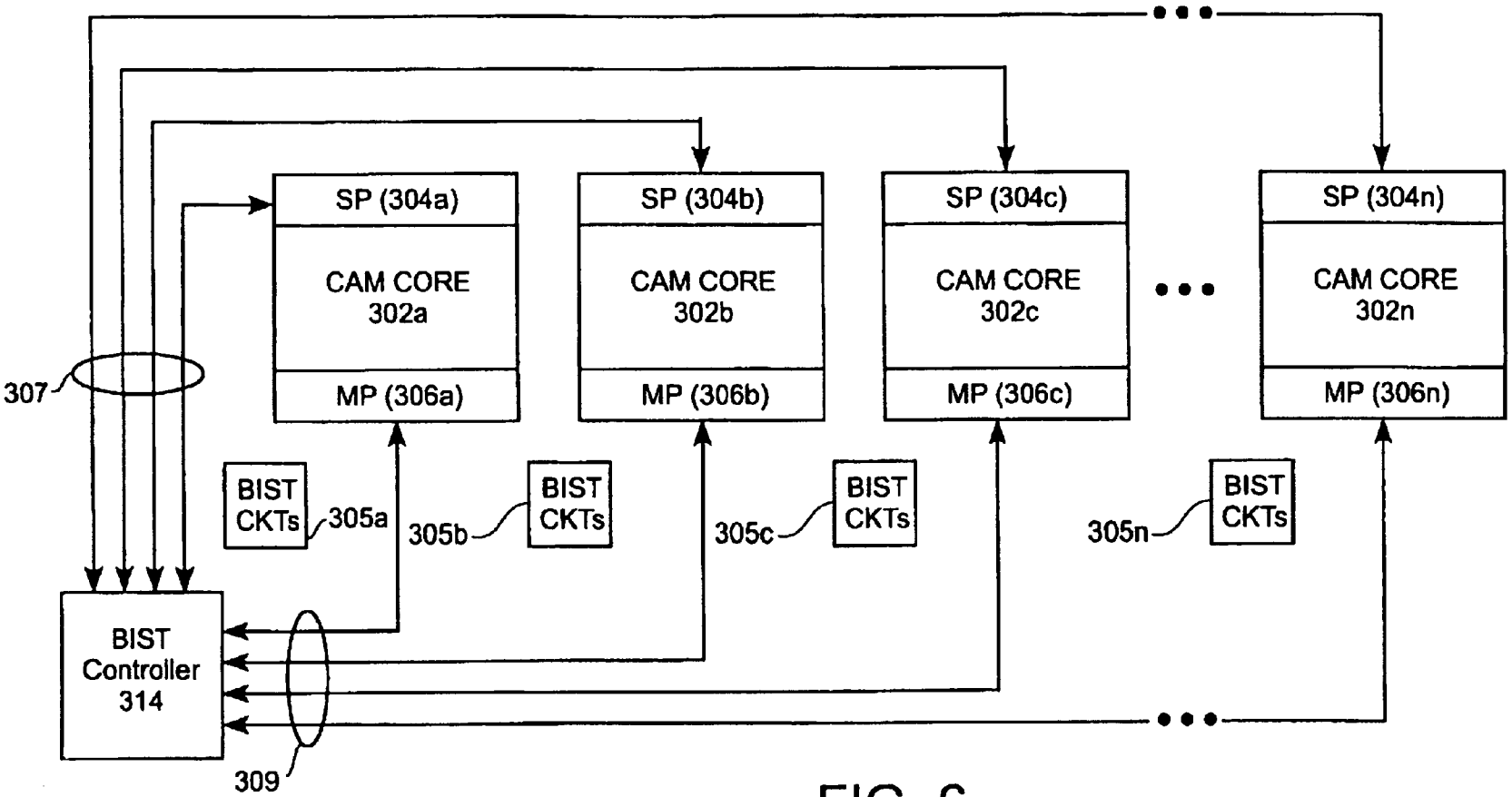
FIG. 6 shows a block diagram of an alternative embodiment of the present invention, in which one BIST controller coordinates testing of multiple CAM cores.

FIG. 6 shows a block diagram of an alternative embodiment of the present invention. In this embodiment, one BIST controller 314 is capable of operating on multiple CAM cores 302. As shown, multiple CAM cores 302a, 302b, 302c and up to 302n each include their respective search ports 304 and maintenance ports 306. Along with replicating the CAM cores 302, the BIST circuits (CKTs) 305 are also replicated. In one embodiment, the BIST circuits 305 include a BIST search interface 312, a search port comparator 340, a BIST maintenance interface 316 and a BIST maintenance comparator 318. For simplicity and for purposes of illustrating the ability of a single BIST controller 314 to operate on any number of CAM cores 302, the signal lines 307 and 309 are shown connected directly to the search ports (SPs) 304 and maintenance ports (MPs) 306. However, in reality, the signals 307 and 309 actually interface with the BIST circuits 305.

In addition to being able to use one BIST controller 314 to execute BIST testing of the CAM cores 302, it is also important to note that the BIST controller 314 can simultaneously perform searches by way of the search ports 304 and writes by way of the maintenance ports 306. The other advantages described above with regard to a single CAM core therefore also apply to embodiments where more than one CAM core is tested using the BIST controller 314.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout. Although any suitable design tool may be used, another layout tool may include a hardware description language "Verilog®" tool available from Cadence Design Systems, Inc. of Santa Clara, Calif.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Additionally, the various block diagrams may be embodied in any form which may include, for example, any suitable computer layout, semiconductor substrate, semiconductor chip or chips, printed circuit boards, packaged integrated circuits, or software implementations. Accordingly, those skilled in the art will recognize that the present embodiments are to be considered as illustrative and not restrictive, and the invention is not to be limited to the details given herein, but may be modified within the scope and equivalents of the appended claims.

What is claimed is:

[1. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core;

a BIST controller for coordinating BIST testing of the CAM core, the BIST controller being capable of performing a BIST search on the CAM core on every cycle through the search port and performing a BIST write at selected times to the CAM core, the BIST write is capable of being performed in a same cycle as the BIST search; and a maintenance port comparator being coupled between the BIST controller and a data output of the maintenance port, the maintenance port being configured to compare an expected data generated by the BIST controller with actual data provided from the data output of the maintenance port.]

[2. A built-in self-test (BIST) circuit for testing a content addressable memory (CAM) core as recited in claim 1, further comprising:

a search port interface for receiving test data, tag data and control signals from the BIST controller during BIST testing, the search port interface being coupled to the search port.]

[3. A built-in self-test (BIST) circuit for testing a content addressable memory (CAM) core as recited in claim 1, further comprising:

a search port comparator being coupled to the search port and the BIST controller, the search port comparator being configured to, compare search addresses generated from the search port in response to BIST search and expected addresses generated by the BIST controller and communicated to the maintenance port, and compare expected hit and multiple hit data generated by the BIST controller with generated hit and multiple hit data output through the search port.]

[4. A built-in self-test (BIST) circuit for testing a content addressable memory (CAM) core as recited in claim 1, further comprising:

a BIST maintenance interface for communicating test data to the CAM core.]

[5. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core; and a BIST controller for coordinating BIST testing of the CAM core, the BIST controller being capable of performing a BIST search on the CAM core on every cycle through the search port and performing a BIST write at selected times to the CAM core, the BIST write is capable of being performed in a same cycle as the BIST search.]

[6. A built-in self-test (BIST) circuit for testing a content addressable memory (CAM) core as recited in claim 1, wherein the search port includes multiplexer logic for selecting between BIST search data and functional search data.]

[7. A built-in self-test (BIST) circuit for testing a content addressable memory (CAM) core as recited in claim 1, wherein the maintenance port includes multiplexer logic for selecting: (a) between BIST row and block addresses and functional mode row and block addresses; and (b) between BIST write data and functional mode write data.]

[8. A built-in self-test (BIST) circuit for testing a content addressable memory (CAM) core as recited in claim 1, further comprising an IEEE 1149.1 controller for communicating control signals to and from the BIST controller.]

[9. A built-in self-test (BIST) circuit for testing a content addressable memory (CAM) core as recited in claim 1, wherein BIST circuit enables BIST searches on every clock cycle, the searches performed on every cycle enabling at-speed BIST testing.]

[10. A built-in self-test (BIST) circuit for testing a content addressable memory (CAM) core as recited in claim 1, further comprising:

a search port comparator;

a search port interface;

a maintenance port comparator; and a maintenance port interface;

wherein the search port interface, the maintenance port interface, the search port comparator, and the maintenance port comparator are each distributed and have expansion capabilities, which limits a number of global wires required to communicate read/write and search data and results.]

[11. A built-in self-test (BIST) circuit for testing a content addressable memory (CAM) core as recited in claim 1, wherein the BIST testing only tests one row per cycle and the BIST testing is separate from a priority encoder (PE) BIST testing.]

[12. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core;

a BIST controller for coordinating BIST testing of the CAM core, the BIST controller being capable of performing a BIST search on the CAM core on every cycle through the search port and performing a BIST write at selected times to the CAM core, the BIST write is capable of being performed in a same cycle as the BIST search; and a search port interface that receives only 1 bit of test data from the BIST controller, other bits being generated internally to the search port interface, so as to limit a number of required global wires.]

[13. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core;

a BIST controller for coordinating BIST testing of the CAM core, the BIST controller being capable of performing a BIST search on the CAM core on every cycle through the search port and performing a BIST write at selected times to the CAM core, the BIST write is capable of being performed in a same cycle as the BIST search; and a BIST maintenance interface for communicating test data to the CAM core, the BIST maintenance interface having a capability to expand 2 bits of data from the BIST controller to a required width, the capability to expand being configured to limit a number of needed global wires.]

[14. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core; and a BIST controller for coordinating BIST testing of the CAM core, the BIST controller being capable of performing a BIST search on the CAM core on every cycle through the search port and performing a BIST write at selected times to the CAM core, the BIST write is capable of being performed in a same cycle as the BIST search, wherein BIST testing of the BIST circuit does not generate matches on all rows in the CAM core so as to enable low-power BIST operation.]

[15. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core; and a BIST controller for coordinating BIST testing of the CAM core, the BIST controller being capable of performing a BIST search on the CAM core on every cycle through the search port and performing a BIST write at selected times to the CAM core, the BIST write is capable of being performed in a same cycle as the BIST search, wherein the CAM core is a ternary CAM core that is capable of storing three states.]

[16. A built-in self-test (BIST) circuit for testing a content addressable memory (CAM) core as recited in claim 15, wherein a word is comprised of two subrows and each of the two subrows include a plurality of binary tag bits and valid bits.]

[17. A built-in self-test (BIST) circuit for testing a content addressable memory (CAM) core, comprising:

a search port for enabling searches of the CAM core;

a maintenance port for enabling addressing of locations of the CAM core, the maintenance port further including writing logic for writing to locations of the CAM core;

a BIST controller for coordinating BIST testing of the CAM core, the BIST controller being capable of performing a BIST search and a BIST write on the CAM core at the same time, wherein the BIST search can be performed on every cycle and the BIST write can be performed at any cycle including a cycle in which the BIST search is performed.]

[18. A built-in self-test (BIST) circuit for testing a content addressable memory (CAM) core as recited in claim 17, wherein the CAM core is a ternary CAM core that is capable of storing three states.]

[19. A built-in self-test (BIST) circuit for testing a content addressable memory (CAM) core as recited in claim 18, wherein a word is comprised of two subrows and each of the two subrows include data bits, and binary tag bits and a valid bit, and the data bits span a 32 bit width, the binary tag bits span 2 bits and the valid bit spans 1 bit.]

[20. A built-in self-test (BIST) circuit for testing a content addressable memory (CAM) core as recited in claim 17, further comprising:

a search port interface for receiving test data, tag data and control signals from the BIST controller during BIST testing, the search port interface being coupled to the search port; and a search port comparator being coupled to the search port and the BIST controller, the search port comparator being configured to, compare search addresses generated from the search port in response to BIST search and expected addresses generated by the BIST controller and communicated to the maintenance port, and compare expected hit and multiple hit data generated by the BIST controller with generated hit and multiple hit data output through the search port.]

[21. A built-in self-test (BIST) circuit for testing a content addressable memory (CAM) core as recited in claim 17, further comprising:

a BIST maintenance interface for communicating test data to the CAM core, the BIST maintenance interface having an expansion capability; and a maintenance port comparator being coupled between the BIST controller and a data output of the maintenance port, the maintenance port being configured to compare an expected data generated by the BIST controller with actual data provided from the data output of the maintenance port.]

[22. A built-in self-test (BIST) circuit for testing a content addressable memory (CAM) core as recited in claim 17, wherein the BIST testing only tests one row per cycle and the BIST testing is separate from a priority encoder (PE) BIST testing.]

[23. Content addressable memory (CAM) circuitry with BIST testing capabilities, comprising:

a plurality of CAM cores;

a plurality of BIST circuits coupled to each of the CAM cores; and a single BIST controller being capable of controlling BIST testing of each of the plurality of CAM cores.]

[24. Content addressable memory (CAM) circuitry with BIST testing capabilities as recited in claim 23, wherein the signal BIST controller is configured to perform BIST searches on each of the plurality of CAM cores during each cycle and is further configured to perform BIST writing during any cycle including a cycle in which the BIST search occurs.]

[25. Content addressable memory (CAM) circuitry with BIST testing capabilities as recited in claim 24, wherein each of the plurality of BIST circuits include:

(a) a BIST search interface;

(b) a search port comparator;

(c) a maintenance port comparator; and (d) a BIST maintenance interface.]

[26. A method for performing built-in self-test (BIST) testing on a content addressable memory (CAM) core, comprising:

writing test data to memory addresses in the CAM core;

searching for test data in the CAM core, the searching being continuously performed one cycle after another and the writing of the test data capable of being performed in a same cycle as one or more search performed during the searching, wherein the CAM core is a ternary CAM core.]

[27. A method for performing built-in self-test (BIST) testing on a content addressable memory (CAM) core as recited in claim 26, further comprising:

selecting one row of the CAM core to be valid during the searching, such that matches only occur in the one row in one of the cycles.]

[28. A method for performing built-in self-test (BIST) testing on a content addressable memory (CAM) core as recited in claim 26, wherein the CAM core has a plurality of words, and each of the plurality of words includes a plurality of binary tag bits and a valid bit.]

[29. A method for performing built-in self-test (BIST) testing on a content addressable memory (CAM) core, comprising:

a search port for enabling searches of the CAM core;

a maintenance port for enabling addressing of locations of the CAM core, the maintenance port further including writing logic for writing to locations of the CAM core; and a BIST controller for coordinating BIST testing of the CAM core, the BIST controller being capable of performing a BIST search and a BIST write on the CAM core at the same time.]

30. A built-in self-test (BIST) circuit for testing a content addressable memory (CAM) core, comprising:

a maintenance port for enabling addressing of locations of the CAM core, the maintenance port further including writing logic for writing to locations of the CAM core;

a BIST controller for coordinating BIST testing of the CAM core, the BIST controller being capable of performing a BIST write at selected times to the CAM core, wherein the BIST controller is capable of performing a BIST search on the BIST write on the CAM core at the same time; and a maintenance port comparator being coupled between the BIST controller and a data output of the maintenance port, the maintenance port comparator being configured to compare an expected data generated by the BIST controller with actual data provided from the data output of the maintanance port.

31. A built-in self-test (BIST) circuit for testing a content addressable memory (CAM) core as recited in claim 30, further comprising:

a BIST maintanance interface for communicating test data to the CAM core.

32. A built-in self-test (BIST) circuit for testing a content addressable memory (CAM) core, comprising:

a maintenance port for enabling addressing of locations of the CAM core, the maintanance port further including writing logic for writing to locations of the CAM core;

a BIST controller for coordinating BIST testing of the CAM core, the BIST controller being capable of performing a BIST write at selected times to the CAM core and performing a BIST search on the CAM core, and wherein the BIST controller is capable of performing the BIST search and the BIST write in a same cycle; and a maintanance port comparator being coupled between the BIST controller and a data outpupt of the maintanance port, the maintanance port comparator being configured to compare an expected data generated by the BIST controller with actual data provided from the data output of the maintenance port.

33. A built-in self-test (BIST) circuit for testing a content addressable memory (CAM) core as recited in claim 32, wherein the BIST search is capable of being performed on every cycle.

34. A built-in self-test (BIST) circuit for testing a content addressable memory (CAM) core as recited in claim 32, further comprising:

a search port for enabling searches the CAM core.

35. A built-in self-test (BIST) circuit for testing a content addressable memory (CAM) core, comprising:

a maintenance port for enabling addressing of locations of the CAM core, the maintenance port further including writing logic for writing to locations of the CAM core;

a BIST controller for coordinating BIST testing of the CAM core, the BIST controller being capable of performing a BIST write at selected times to the CAM core and performing another operation on the CAM core, the BIST write is capable of being performed in a same cycle as the another operation; and a maintenance port comparator being coupled between the BIST controller and a data output of the maintanance port, the maintenance port comparator being configured to compare an expected data generated by the BIST controller with actual data provided from the data output of the maintenance port.

36. A built-in self-test (BIST) circuit for testing a content addressable memory (CAM) core as recited in claim 35, wherein the another operation is a BIST operation.

37. A built-in self-test (BIST) circuit for testing a content addressable memory (CAM) core as recited in claim 35, wherein the another operation is capable of being performed on the CAM core on every cycle.

38. A built-in self-test (BIST) circuit for testing a content addressable memory (CAM) core as recited in claim 35, wherein the maintenance port includes multiplexer logic for selecting:

(a) between BIST row and block addresses and functional mode row and block addresses; and (b) between BIST write data and functional mode write data.

*39. An apparatus for testing a content addressable memory (CAM) core, comprising:*

*means for enabling searches of the CAM core;*

*means for enabling addressing of locations of the CAM core, said addressing enabling means further comprising means for writing to locations of the CAM core;*

*means for coordinating BIST testing of the CAM core, said BIST testing coordinating means being capable of performing a BIST search on the CAM core on every cycle through said search enabling means and performing a BIST write at selected times to the CAM core, wherein the BIST write is capable of being performed in a same cycle as the BIST search; and*

*maintenance port comparing means for comparing an expected data generated by said BIST testing coordinating means with actual data provided from a data output of said addressing enabling means, said maintenance port comparing means being coupled between said BIST testing coordinating means and the data output of said addressing enabling means.*

*40. The apparatus as claimed in claim 39, further comprising:*

*means for receiving test data, tag data, or control signals, or combinations thereof, from said BIST testing coordinating means during BIST testing, said receiving means being coupled to said search enabling means.*

*41. The apparatus as claimed in claim 39, further comprising:*

*search port comparing means for comparing search data being coupled to said search enabling means and said BIST testing coordinating means, said search port comparing means being capable of:*

*comparing search addresses generated from said search enabling means in response to BIST search and expected addresses generated by said BIST testing coordinating means and communicated to said addressing enabling means; and*

*comparing expected hit and multiple hit data generated by said BIST testing coordinating means with generated hit and multiple hit data output through said search enabling means.*

*42. The apparatus as claimed in claim 39, further comprising:*

*means for communicating test data to the CAM core.*

*43. An apparatus for testing a content addressable memory (CAM) core, comprising:*

*means for enabling searches of the CAM core;*

*means for enabling addressing of locations of the CAM core, said addressing enabling means further including means for writing to locations of the CAM core; and*

*means for coordinating BIST testing of the CAM core, said BIST testing coordinating means being capable of performing a BIST search on the CAM core on every cycle through said search enabling means and performing a BIST write at selected times to the CAM core, wherein the BIST write is capable of being performed in a same cycle as the BIST search.*

*44. The apparatus as claimed in claim 43, wherein said search enabling means includes means for selecting between BIST search data and functional search data.*

*45. The apparatus as claimed in claim 43, wherein said addressing enabling means includes means for selecting between BIST row and block addresses and functional mode*

*row and block addresses, or between BIST write data and functional mode write data or combinations thereof.*

*46. The apparatus as claimed in claim 43, further comprising means for communicating control signals to and from said BIST testing coordinating means.*

*47. The apparatus as claimed in claim 43, further comprising means for enabling BIST searches on one or more clock cycles, the searches being capable of being performed on one or more cycles enabling at-speed BIST testing.*

*48. The apparatus as claimed in claim 43, further comprising:*

*search port comparing means for comparing search data;*

*means for receiving test data, tag data, or control signals, or combinations thereof;*

*maintenance port comparing means for comparing maintenance data; and*

*means for interfacing a means for enabling addressing of locations of the CAM core;*

*wherein said receiving means, said means for interfacing an addressing enabling means, said search port comparing means, or said maintenance port comparing means, or combinations thereof, are distributed and have expansion capabilities, and being capable of limiting a number of global wires required to communicate read/write or search data or results, or combinations thereof.*

*49. The apparatus as claimed in claim 43, wherein the BIST testing comprises testing one row per cycle and the BIST testing is separate from a priority encoder (PE) BIST testing.*

*50. An apparatus for testing a content addressable memory (CAM) core, comprising:*

*means for enabling searches of the CAM core;*

*means for enabling addressing of locations of the CAM core, said addressing enabling means further including means for writing to locations of the CAM core;*

*means for coordinating BIST testing of the CAM core, said BIST testing coordinating means being capable of performing a BIST search on the CAM core on every cycle through said search enabling means and performing a BIST write at selected times to the CAM core, wherein the BIST write is capable of being performed in a same cycle as the BIST search; and*

*means for receiving test data, tag data, or control signals, or combinations thereof capable of receiving one bit of test data from said BIST testing coordinating means, other bits being generated internally to said receiving means, and capable of limiting a number of required global wires.*

*51. An apparatus for testing a content addressable memory (CAM) core, comprising:*

*means for enabling searches of the CAM core;*

*means for enabling addressing of locations of the CAM core, said addressing enabling means further including means for writing to locations of the CAM core;*

*means for coordinating BIST testing of the CAM core, said BIST testing coordinating means being capable of performing a BIST search on the CAM core on every cycle through said search enabling means and performing a BIST write at selected times to the CAM core, the BIST write is capable of being performed in a same cycle as the BIST search; and*

*means for communicating test data to the CAM core, said test data communicating means having a capability to expand two bits of data from said BIST testing coordinating means to a required width, the capability to expand being capable of limiting a number of needed global wires.*

*52. An apparatus for testing a content addressable memory (CAM) core, comprising:*

*means for enabling searches of the CAM core;*

*means for enabling addressing of locations of the CAM core, said addressing enabling means further including means for writing to locations of the CAM core; and*

*means for coordinating BIST testing of the CAM core, said BIST testing coordinating means being capable of performing a BIST search on the CAM core on every cycle through said search enabling means and performing a BIST write at selected times to the CAM core, the BIST write is capable of being performed in a same cycle as the BIST search, wherein BIST testing of the BIST circuit does not generate matches on one or more rows in the CAM core so as to enable lower-power BIST operation.*

*53. An apparatus for testing a content addressable memory (CAM) core, comprising:*

*means for enabling searches of the CAM core;*

*means for enabling addressing of locations of the CAM core, said addressing enabling means further including means for writing to locations of the CAM core; and*

*means for coordinating BIST testing of the CAM core, said BIST testing coordinating means being capable of performing a BIST search on the CAM core on every cycle through said search enabling means and performing a BIST write at selected times to the CAM core, wherein the BIST write is capable of being performed in a same cycle as the BIST search wherein the CAM core is a ternary CAM core that is capable of storing three states.*

*54. The apparatus as claimed in claim 53, wherein a word comprises two subrows and one or more of the two subrows includes one or more binary tag bits or valid bits, or combinations thereof.*

*55. An apparatus for testing a content addressable memory (CAM) core, comprising:*

*means for enabling searches of the CAM core;*

*means for enabling addressing of locations of the CAM core, said addressing enabling means further including means for writing to locations of the CAM core;*

*means for coordinating BIST testing of the CAM core, said BIST testing coordinating means being capable of performing a BIST search and a BIST write on the CAM core at the same time, wherein the BIST search is capable of being performed on every cycle and the BIST write can be performed at any cycle including a cycle in which the BIST search is performed.*

*56. The apparatus as claimed in claim 55, wherein the CAM core is a ternary CAM core that is capable of storing three states.*

*57. The apparatus as claimed in claim 56, wherein a word comprises two subrows and each of the two subrows include data bits, or binary tag bits or a valid bit, or combinations thereof, and the data bits span a 32 bit or equivalent width, the binary tag bits span two bits or equivalent or the valid bit spans one bit or equivalent, or combinations thereof.*

*58. The apparatus as claimed in claim 55, further comprising:*

*means for receiving test data, tag data, or control signals, or combinations thereof, from said BIST testing coordinating means during BIST testing, said receiving means being coupled to said search enabling means; and*

*search port comparing means for comparing search data being coupled to said search enabling means and said BIST testing coordinating means, said search port comparing means being capable of:*

*comparing search addresses generated from said search enabling means in response to BIST search and expected addresses generated by said BIST testing coordinating means and communicated to said addressing enabling means; and*

*comparing expected hit or multiple hit data, or combinations thereof, generated by said BIST testing coordinating means with generated hit or multiple hit data or combinations thereof, output through said search enabling means.*

*59. The apparatus as claimed in claim 55, further comprising:*

*means for communicating test data to the CAM core, said test data communicating means having an expansion capability; and*

*maintenance port comparing means for comparing maintenance data being coupled between said BIST testing coordinating means and a data output of said addressing enabling means, said maintenance port comparing means being configured to compare an expected data generated by said BIST testing coordinating means with actual data provided from the data output of said addressing enabling means.*

*60. The apparatus as claimed in claim 55, wherein the BIST testing comprises testing one row per cycle and the BIST testing is separate from a priority encoder (PE) BIST testing.*

*61. An apparatus, comprising:*

*one or more CAM cores;*

*means for performing a built-in self test BIST coupled to one or more of the CAM cores and capable of testing each of the one or more CAM cores; and*

*means for controlling said means for performing the BIST.*

*62. The apparatus as claimed in claim 61, wherein said controlling means is capable of performing BIST searches on one or more of the CAM cores during one or more cycles and is further capable of performing BIST writing during any cycle including a cycle in which a BIST search occurs.*

*63. The apparatus as claimed in claim 62, wherein the means for performing the BIST comprises:*

*means for interfacing said controlling means;*

*search port comparing means for comparing search data;*

*maintenance port comparing means for comparing maintenance data; and*

*means for communicating test data to one or more CAM cores.*

*64. An apparatus for performing built-in self-test (BIST) testing on a content addressable memory (CAM) core, comprising:*

*means for writing test data to memory addresses in the CAM core;*

*means for searching for test data in the CAM core, the searching being capable of being continuously performed one cycle after another, or the writing of the test data capable of being performed in a same cycle as one or more search performed during the searching, or combinations thereof, wherein the CAM core is a ternary CAM core.*

*65. The apparatus as claimed in claim 64, further comprising:*

*means for selecting one row of the CAM core to be valid during the searching, such that matches occur in the one row in one of the cycles.*

*66. The apparatus as claimed in claim 64, wherein the CAM core comprises one or more words, and one or more of the words includes one or more binary tag bits or a valid bit, or combinations thereof.*

*67. An apparatus for performing built-in self-test (BIST) testing on a content addressable memory (CAM) core, comprising:*

*means for enabling searches of the CAM core;*

*means for enabling addressing of locations of the CAM core, said addressing enabling means further including means for writing to locations of the CAM core; and*

*means for coordinating BIST testing of the CAM core, said BIST testing coordinating means being capable of performing a BIST search and a BIST write on the CAM core at the same time.*

* * * * *

UNITED STATES PATENT AND TRADEMARK OFFICE

CERTIFICATE OF CORRECTION

PATENT NO. : RE41,992 E
APPLICATION NO. : 11/514286
DATED : December 7, 2010
INVENTOR(S) : Gupta et al.

It is certified that error appears in the above-identified patent and that said Letters Patent is hereby corrected as shown below:

Column 9, line 28, delete "lest" and insert -- test --.

Column 10, line 3, delete "missdid" and insert -- miss did --.

Column 10, line 30, delete "FIG. 51" and insert -- FIG. 5I --.

Column 18, line 57 to Column 20, line 2, delete Claims 30-38.

Column 23, line 35, in Claim 61, delete "*self test*" and insert -- *self-test* --.

Signed and Sealed this
Nineteenth Day of July, 2011

David J. Kappos

David J. Kappos
*Director of the United States Patent and Trademark Office*